US012632623B2

(12) United States Patent
Maragakis et al.

(10) Patent No.: US 12,632,623 B2
(45) Date of Patent: May 19, 2026

(54) MODELING PHYSICAL SYSTEMS WITH LARGE LANGUAGE MACHINE-LEARNED MODELS

(71) Applicant: D. E. Shaw Research, LLC, New York, NY (US)

(72) Inventors: Paul Maragakis, New York, NY (US); Andreas Kraemer, Brooklyn, NY (US); James P. Roney, Cambridge, MA (US); Peter Skopp, Westport, CT (US)

(73) Assignee: D. E. Shaw Research, LLC, New York, NY (US)

( * ) Notice: Subject to any disclaimer, the term of this patent is extended or adjusted under 35 U.S.C. 154(b) by 0 days.

(21) Appl. No.: 18/814,374

(22) Filed: Aug. 23, 2024

(65) Prior Publication Data

US 2026/0057148 A1 Feb. 26, 2026

(51) Int. Cl.
*G06F 30/27* (2020.01)
*G06N 3/084* (2023.01)

(52) U.S. Cl.
CPC ............. *G06F 30/27* (2020.01); *G06N 3/084* (2013.01)

(58) Field of Classification Search
None
See application file for complete search history.

(56) References Cited

U.S. PATENT DOCUMENTS

| | | | |
|---|---|---|---|
| 7,684,975 B2 | 3/2010 | Aoki et al. | |
| 8,463,759 B2 | 6/2013 | Johnson | |

| | | | |
|---|---|---|---|
| 9,537,504 B1 | 1/2017 | Guilford et al. | |
| 11,615,246 B2 | 3/2023 | Reisswig | |
| 2018/0082171 A1 | 3/2018 | Merity et al. | |
| 2018/0373705 A1 | 12/2018 | Kwon | |
| 2022/0398445 A1 | 12/2022 | Polleri et al. | |
| 2023/0238085 A1 | 7/2023 | Jang et al. | |

(Continued)

OTHER PUBLICATIONS

Fu, Cong et al. "Fragment and Geometry Aware Tokenization of Molecules for Structure-Based Drug Design Using Language Models." arXiv.org (2024): n. pag. Print. (Year: 2024).*

(Continued)

*Primary Examiner* — Anna Skibinsky
*Assistant Examiner* — Joseph Pulliam
(74) *Attorney, Agent, or Firm* — Fenwick & West LLP

(57) ABSTRACT

A predictive system may access a set of physical structures corresponding to a physical system. Each physical structure representative of a configuration. The predictive system may encode the accessed physical structures to produce a set of encoded physical structures by encoding, for each accessed physical structure, a position of each constituent unit of the physical system within the accessed physical structure. The predictive system may train a machine-learned model using the encoded physical structures. The predictive system may retrain the machine-learned model by iteratively: accessing a set of two or more candidate physical structures, determining a first energy difference among the set of candidate physical structures, obtaining a second energy difference between a set of physical structures corresponding to the set of candidate physical structures using a method to calculate reference energy values.

28 Claims, 14 Drawing Sheets

(56) References Cited

U.S. PATENT DOCUMENTS

2024/0184982 A1    6/2024    Mathewson et al.
2025/0175193 A1    5/2025    Najjar et al.

OTHER PUBLICATIONS

Chennakesavalu, Shriram et al. "Energy Rank Alignment: Using Preference Optimization to Search Chemical Space at Scale." arXiv.org (2024): n. pag. Print. (Year: 2024).*

Hedelius, Bryce E, Damon Tingey, and Dennis Della Corte. "TrIPTransformer Interatomic Potential Predicts Realistic Energy Surface Using Physical Bias." Journal of chemical theory and computation 20.1 (2024): 199-211. Web. (Year: 2025).*

Seunghoon Yi, Youngwoo Cho et al. Towards Physically Reliable Molecular Representation Learning, Proceedings of the Thirty-Ninth Conference on Uncertainty in Artificial Intelligence, PMLR 216:2433-2443, 2023. (Year: 2023).*

Frank, J. Thorben et al. "A Euclidean Transformer for Fast and Stable Machine Learned Force Fields." Nature communications 15.1 (2024): n. pag. Web. (Aug. 6, 2024). (Year: 2024).*

Antunes, L.M et al., "Crystal Structure Generation with Autoregressive Large Language Modeling," arXiv:2307.04340v2, Jul. 18, 2023, pp. 1-19.

Billera, L. et al., "The Continuous Language of Protein Structure," bioRxiv, May 11, 2024, pp. 1-13.

Bran, A.M. et al., "Transformers and Large Language Models for Chemistry and Drug Discovery," arXiv:2310.06083v1, Oct. 9, 2023, pp. 1-22.

Choudhary, K., "AtomGPT: Atomistic Generative Pre-trained Transformer for Forward and Inverse Materials Design," arXiv:2405.03680v1, May 6, 2024, pp. 1-20.

Ciccotti, G. et al., "Blue Moon Sampling, Vectorial Reaction Coordinates, and Unbiased Constrained Dynamics," ChemPhysChem, 6, Sep. 2005, pp. 1809-1814.

Felardos, L et al., "Designing losses for data-free training of normalizing flows on boltzmann distributions," arXiv:2301.05475v1, Jan. 13, 2023, pp. 1-31.

Flam-Shepherd, D. et al., "Atom-by-atom protein generation and beyond with language models," arXiv:2308.09482v1, Aug. 16, 2023, pp. 1-18.

Flam-Shepherd, D. et al., "Language models can generate molecules, materials, and protein binding sites directly in three dimensions as XYZ, CIF, and PDB files," arXiv:2305.05708v1, May 9, 2023, pp. 1-14.

Flam-Shepherd, D. et al., "Language models can learn complex molecular distributions," Nature Communications, 13, Jun. 2022, pp. 1-10.

Fu, C. et al., "Fragment and geometry aware tokenization of molecules for structure-based drug design using language models," arXiv:2408.09730, Aug. 19, 2024, pp. 1-22.

Gaujac, B. et al., "Learning the Language of Protein Structure," arXiv:2405.15840v1, May 24, 2024, pp. 1-20.

Gebauer, N. et al., "Symmetry-adapted generation of 3d point sets for the targeted discovery of molecules," 33rd Conference on Neural Information Processing Systems (NeurIPS 2019), Dec. 2019, pp. 1-13.

Gruver, N. et al., "Fine-Tuned Language Models Generate Stable Inorganic Materials as Text," arXiv:2402.04379v1, Feb. 6, 2024, pp. 1-20.

Hayes, T. et al., "Simulating 500 million years of evolution with a language model," bioRxiv preprint, Jul. 2024, pp. 1-68.

Hu, E.J. et al., "Amortizing Intractable Inference in Large Language Models," arXiv:2310.04363v2, Mar. 13, 2024, pp. 1-31.

Köhler, J. et al., "Flow-matching: Efficient coarse-graining of molecular dynamics without forces," Journal of Chemical Theory and Computation, Jan. 2023, pp. 942-952.

Krämer, A. et al., "Statistically Optimal Force Aggregation for Coarse-Graining Molecular Dynamics," Journal of Physical Chemistry Letters, 14, Apr. 20, 2023, pp. 3970-3979.

Li, X. et al., "Geometry Informed Tokenization of Molecules for Language Model Generation," arXiv:2408.10120, Aug. 19, 2024, pp. 1-34.

Lin, Z. et al., "Evolutionary-scale prediction of atomic-level protein structure with a language model," bioRxiv preprint, Oct. 31, 2022, pp. 1-28.

Livine, M. et al., "nach0: multimodal natural and chemical languages foundation model," Chemical Science, vol. 15, May 8, 2024, pp. 8380-8389.

Noé, F. et al., "Boltzmann generators: Sampling equilibrium states of many-body systems with deep learning," Science, vol. 365, Sep. 2019, pp. 1-18.

Noid, W.G et al., "The multiscale coarse-graining method. I. A rigorous bridge between atomistic and coarse-grained models," Journal of Chemical Physics, 128:244114, Jun. 2008, pp. 1-11.

Richter, L. et al., "VarGrad: A Low-Variance Gradient Estimator for Variational Inference," Advances in Neural Information Processing Systems, Dec. 2020, pp. 1-12.

Touvron, H. et al., "Llama 2: Open foundation and fine-tuned chat models," arXiv:2307.09288v2, Jul. 19, 2023, pp. 1-77.

Vaswani, A. et al., "Attention Is All You Need," 31st Conference on Neural Information Processing Systems (NIPS 2017), Dec. 2017, pp. 1-11.

Wang, J. et al., "Machine Learning of Coarse-Grained Molecular Dynamics Force Fields," ACS Central Science, 5, Apr. 15, 2019, pp. 755-767.

Zholus, A. et al., "BindGPT: A Scalable Framework for 3D Molecular Design via Language Modeling and Reinforcement Learning," arXiv:2406.03686v1, Jun. 2024, pp. 1-23.

Patent Cooperation Treaty, International Search Report, PCT Application No. PCT/US2025/043199, Dec. 9, 2025, 123 pages.

Qiao et al. "OrbNet: Deep Learning for Quantum Chemistry Using Symmetry-Adapted Atomic-Orbital Features", Jan. 18, 2022, 11 pages.

Wang et al "Token-Mal 1.0: Tokenized drug design with large language model", Jul. 10, 2024, 59 pages.

* cited by examiner

100

<key:SMILES>                                              340
[ H ] C ( [ H ] ) ( [ H ] ) C ( = O ) N C ... (token per character)
<separator>
<key:3D>
<H>  XXXXXXXXXXXXXX  (tokens for 3D coords of first H atom)
<C>  XXXXXXXXXXXXXX  (tokens for 3D coords of first C atom)
                                                342

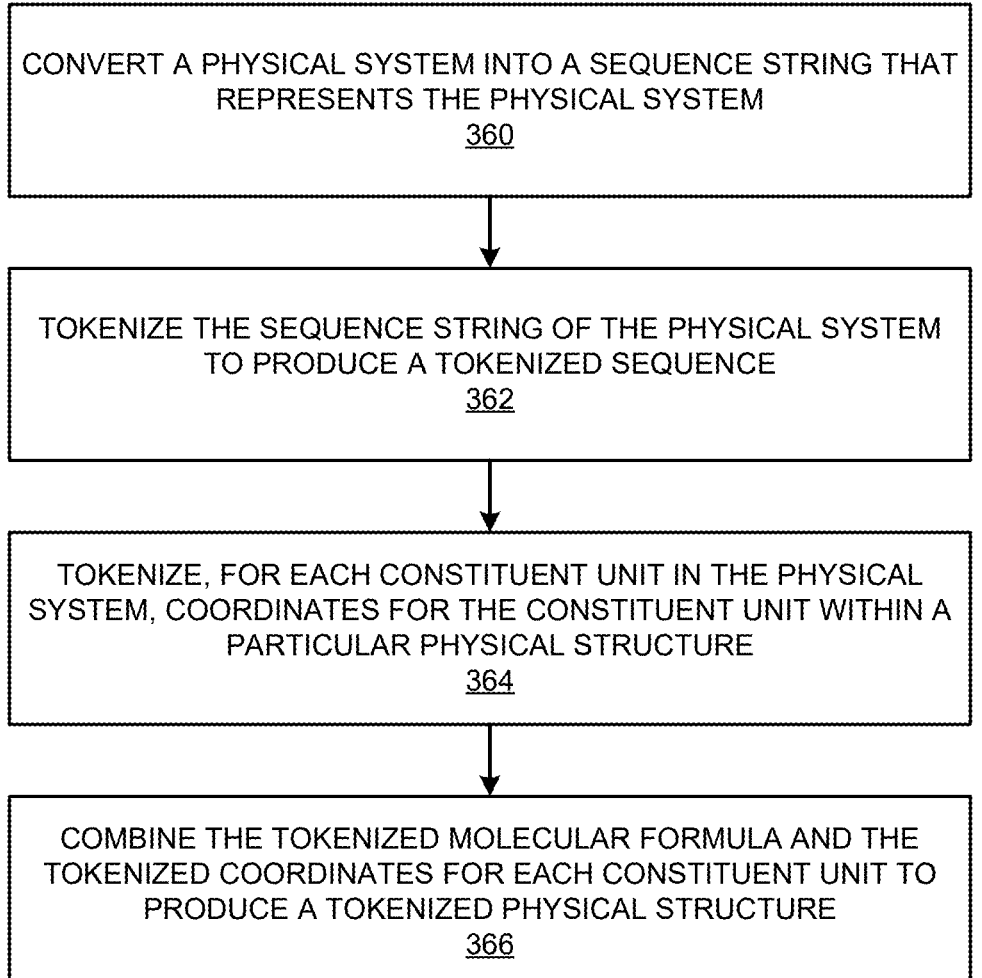

CONVERT A PHYSICAL SYSTEM INTO A SEQUENCE STRING THAT REPRESENTS THE PHYSICAL SYSTEM
360

TOKENIZE THE SEQUENCE STRING OF THE PHYSICAL SYSTEM TO PRODUCE A TOKENIZED SEQUENCE
362

TOKENIZE, FOR EACH CONSTITUENT UNIT IN THE PHYSICAL SYSTEM, COORDINATES FOR THE CONSTITUENT UNIT WITHIN A PARTICULAR PHYSICAL STRUCTURE
364

COMBINE THE TOKENIZED MOLECULAR FORMULA AND THE TOKENIZED COORDINATES FOR EACH CONSTITUENT UNIT TO PRODUCE A TOKENIZED PHYSICAL STRUCTURE
366

RECEIVE A SET OF TOKENS
410

EXECUTE ONE OR MORE ATTENTION MECHANISMS TO GENERATE LOGITS FOR A SET OF CANDIDATE TOKENS THAT ARE CANDIDATES FOR THE NEXT TOKEN
412

CONVERT LOGITS OF THE SET OF CANDIDATE TOKENS TO CORRESPONDING ENERGY VALUES
414

SELECT ONE OF THE CANDIDATE TOKENS IN THE SET TO BE THE SELECTED NEXT TOKEN BASED ON THE ENERGY VALUES
416

400

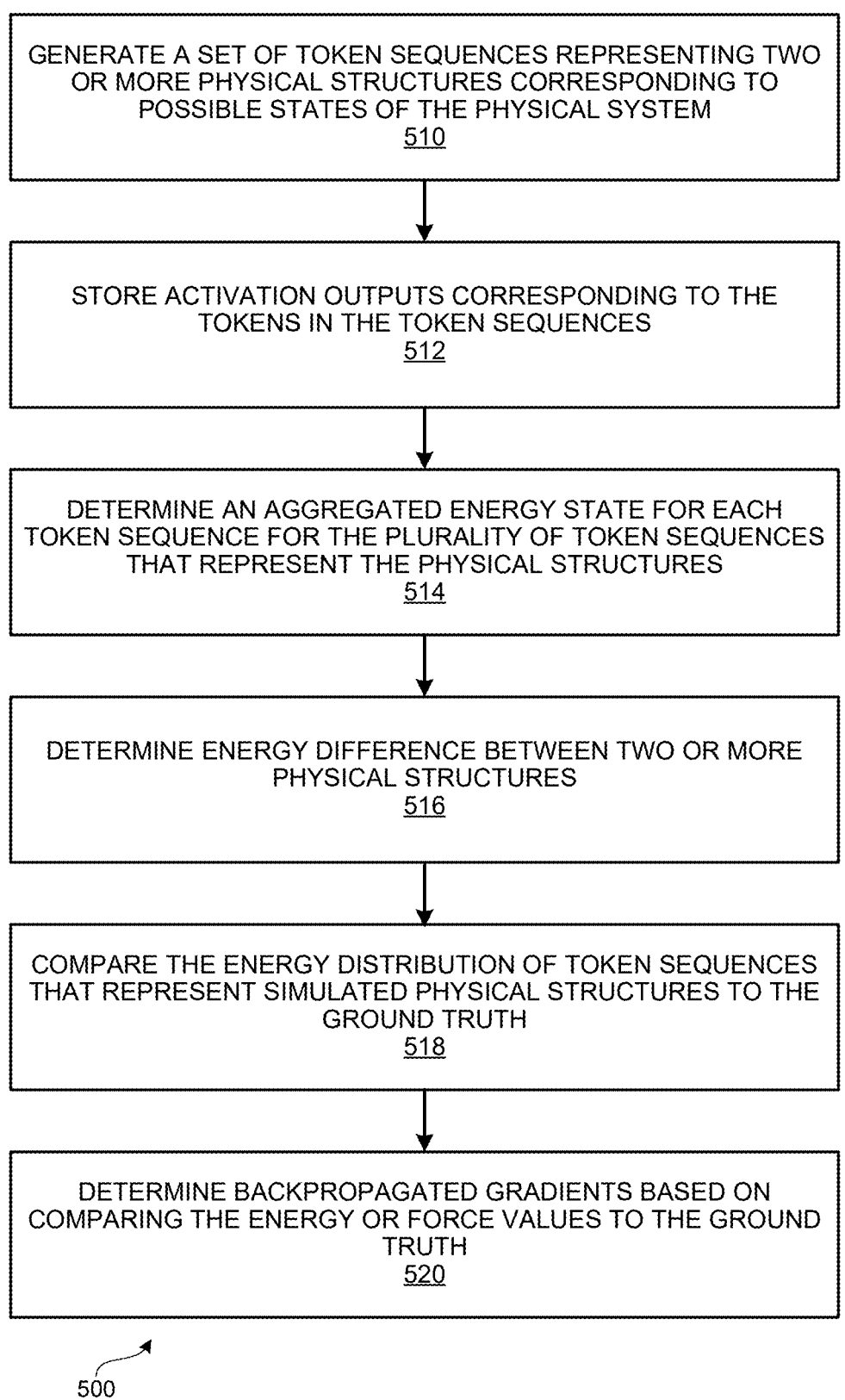

GENERATE A SET OF TOKEN SEQUENCES REPRESENTING TWO OR MORE PHYSICAL STRUCTURES CORRESPONDING TO POSSIBLE STATES OF THE PHYSICAL SYSTEM
510

STORE ACTIVATION OUTPUTS CORRESPONDING TO THE TOKENS IN THE TOKEN SEQUENCES
512

DETERMINE AN AGGREGATED ENERGY STATE FOR EACH TOKEN SEQUENCE FOR THE PLURALITY OF TOKEN SEQUENCES THAT REPRESENT THE PHYSICAL STRUCTURES
514

DETERMINE ENERGY DIFFERENCE BETWEEN TWO OR MORE PHYSICAL STRUCTURES
516

COMPARE THE ENERGY DISTRIBUTION OF TOKEN SEQUENCES THAT REPRESENT SIMULATED PHYSICAL STRUCTURES TO THE GROUND TRUTH
518

DETERMINE BACKPROPAGATED GRADIENTS BASED ON COMPARING THE ENERGY OR FORCE VALUES TO THE GROUND TRUTH
520

MODELING PHYSICAL SYSTEMS WITH LARGE LANGUAGE MACHINE-LEARNED MODELS

TECHNICAL FIELD

The instant disclosure is related to a machine-learned model that combines language capabilities with capabilities to model physical systems.

BACKGROUND

Simulating dynamic physical systems presents significant challenges that extend beyond the rotational or dynamic nature of the systems themselves. One major issue is the sampling problem, where the number of feasible states that a system can occupy is vast, such as the number of potential configurations of in a physical system. The time required for the system to transition between these states is often much longer than what can be realistically simulated, making it difficult to capture the full scope of the system's behavior.

Another challenge is the force field problem, which arises from the intricate physical interactions between constituent units that determine the energy and corresponding forces within the system. Accurately computing these interactions is computationally intensive, necessitating the use of simpler approximations that often compromise on precision. This trade-off between accuracy and computational feasibility is a central concern in the simulation of complex systems.

Additionally, simulations frequently employ simplified conditions that do not directly correspond to the actual environments. This simplification can result in discrepancies between the simulated outcomes and real-world behaviors, limiting the applicability and reliability of the simulations. These challenges underscore the complexity involved in accurately simulating dynamic physical systems and highlight the need for advanced computational techniques to improve the fidelity and applicability of these simulations.

SUMMARY

In some embodiments, the disclosure described herein relate to a method including: accessing, by a predictive system, a set of physical structures corresponding to a physical system, each physical structure representative of a configuration of the physical system; encoding, by the predictive system, the accessed physical structures to produce a set of encoded physical structures by encoding, for each accessed physical structure, a position of each constituent unit within the accessed physical structure; training, by the predictive system, a machine-learned model; and retraining, by the predictive system, the machine-learned model by iteratively: accessing a set of two or more candidate physical structures for the physical system; determining using the machine-learned model a first energy difference among the set of candidate physical structures for the physical system, the first energy difference corresponding to a ranking of the machine-learned model; obtaining a second energy difference between a set of physical structures corresponding to the set of candidate physical structures using an energy function; and retraining the machine-learned model using the set of candidate physical structures, the first energy difference, and the second energy difference.

In some embodiments, the disclosure described herein relate to a method, wherein encoding an accessed physical structure includes: converting one or more structural expressions of the physical system into a sequence string representation of the physical system; tokenizing the sequence string representation of the physical system to produce a tokenized structural expression; tokenizing, for each constituent unit in the physical system, coordinates for the constituent unit within the accessed physical structure to produce tokenized coordinates for the constituent unit; and combining the tokenized structural expression and the tokenized coordinates for each constituent unit to produce a tokenized physical structure corresponding to the accessed physical structure.

In some embodiments, the disclosure described herein relate to a method, wherein tokenizing coordinates for the constituent unit within the accessed physical structure includes: pixelating a rendered sphere to produce a set of pixels each corresponding to a location on the surface of the rendered sphere; tokenizing, for a first constituent unit in the physical system, coordinates at a center of the sphere; and tokenizing, for each additional constituent unit in the physical system, coordinates corresponding to a pixel selected from the set of pixels based on a location of the additional constituent unit relative to the center of the sphere.

In some embodiments, the disclosure described herein relate to a method, wherein tokenizing coordinates for the constituent unit within the accessed physical structure includes using a Cartesian coordinate system, an xyz coordinate system, an octree coordinate system, a polar coordinate system, a cylindrical coordinate system, or a barycentric coordinate system to generate the coordinates.

In some embodiments, the disclosure described herein relate to a method, wherein the sequence string representation of the physical system includes an ordered set of constituent units, and wherein the coordinates for a constituent unit include coordinates relative to a center of a coordinate sphere.

In some embodiments, the disclosure described herein relate to a method, wherein the machine-learned model is iteratively retrained until one or more retraining criteria is satisfied.

In some embodiments, the disclosure described herein relate to a method, wherein the retraining criteria is satisfied when performance measurement of a holdout set starts to decrease.

In some embodiments, the disclosure described herein relate to a method, wherein retraining the machine-learned model includes modifying weights of one or more layers of the machine-learned model to minimize a difference between the first energy difference and the second energy difference over subsequent iterations.

In some embodiments, the disclosure described herein relate to a method, wherein retraining the machine-learned model includes modifying weights of one or more layers of the machine-learned model by: generating a set of token sequences representing two or more physical structures; store activation outputs corresponding to the tokens in the token sequences; determining an aggregated energy state for each token sequence; and determining backpropagated gradients based on comparing the aggregated energy states for the token sequences.

In some embodiments, the disclosure described herein relate to a method, wherein the first energy difference is determined based at least in part on a Boltzmann probability ratio between the set of candidate physical structures.

In some embodiments, the disclosure described herein relate to a method, wherein the machine-learned model is configured to: determine, for a candidate physical structure, a force associated with each constituent unit in the physical system based on a relative energy associated with a plurality of neighboring positions for the constituent unit.

In some embodiments, the disclosure described herein relate to a method, wherein the machine-learned model is retrained based on a difference in forces associated with the candidate physical structures.

In some embodiments, the disclosure described herein relate to a method, wherein the force associated with each constituent unit in the model is based on a collective gradient of the relative energy associated with the plurality of neighboring positions for the constituent unit, wherein the collective gradient is determined based on a vector to a neighboring position from which a finite difference gradient is calculated.

In some embodiments, the disclosure described herein relate to a method, wherein a determined force associated with a constituent unit in the physical system is based on forces associated with one or more preceding constituent units in a sequence string representation of the physical system.

In some embodiments, the disclosure described herein relate to a method, wherein the relative energies associated with each of the plurality of neighboring positions for the constituent unit are determined using a softmax output of the machine-learned model.

In some embodiments, the disclosure described herein relate to a method, wherein a determined force associated with a constituent unit in the physical system is based on, for each of the plurality of neighboring positions for the constituent unit, the relative energy associated with the neighboring position and a distance between the constituent unit and the neighboring position.

In some embodiments, the disclosure described herein relate to a method, wherein a determined force generated by the machine-learned model associated with a constituent unit in the physical system is based additionally on reference forces applied from a solvent or solution on the constituent unit in the physical system.

In some embodiments, the disclosure described herein relate to a method, wherein a determined force generated by the machine-learned model associated with a constituent unit in the physical system is based additionally on inherent forces in a physical system including the physical system.

In some embodiments, the disclosure described herein relate to a method, wherein a constituent unit in an encoded physical structure is encoded with multiple tokens, each token representing decreasing significance of the constituent unit's coordinates.

In some embodiments, the disclosure described herein relate to a method, further including fine tuning, by the predictive system, the machine-learning model by using experimentally determined structures of the physical system, optionally wherein the experimentally determined structures includes a crystallographic structure of the physical system.

In some embodiments, the disclosure described herein relate to a method, further including: generating, by the predictive system, a probability distribution of structures for a physical system or a portion thereof.

In some embodiments, the disclosure described herein relate to a method, further including: comparing a target probability distribution and the generated probability distribution to predict a binding affinity between a first physical system or a portion thereof and a second physical system or a portion thereof.

In some embodiments, the disclosure described herein relate to a method, wherein obtaining the second energy difference includes performing a quantum mechanical energy calculation.

In some embodiments, the disclosure described herein relate to a method, wherein encoding an accessed physical structure includes using a roto-translational transformation to encode spatial data of one or more constituent units in the physical system.

In some embodiments, the disclosure described herein relate to a method, wherein the machine-learned model is a pretrained machine-learned language model and retraining the machine-learned model includes fine tuning the machine-learned model using training samples of physical systems.

In some embodiments, the disclosure described herein relate to a method, further including: computing importance weights based on the first and second energy differences, determining confidence levels, or selecting configurations based on the first and second energy differences.

In some embodiments, the disclosure described herein relate to a method, wherein encoding the accessed physical structures includes generating a series of tokens, and generating the series of tokens includes: generating, for a first constituent unit, a first set of tokens; and generating, for a second constituent unit, a second set of tokens based on the first set of tokens.

In some embodiments, the disclosure described herein relate to a method, wherein encoding the accessed physical structures includes generating a series of tokens, and generating the series of tokens includes: generating a first token for each constituent unit in a set of constituent units in the physical system, wherein the first token of a particular constituent unit represents most significant bits of coordinates of the particular constituent unit; generating a second token for each constituent unit in the physical system after the first tokens of the set of constituent units are generated, wherein the second token of the particular constituent unit represents less significant bits of the coordinates of the particular constituent unit.

In some embodiments, the disclosure described herein relate to a method including: accessing, by a predictive system, a set of physical structures corresponding to a physical system, each physical structure representative of a configuration of the physical system; encoding, by the predictive system, the accessed physical structures to produce a set of encoded physical structures by encoding, for each accessed physical structure, a position of each constituent unit within the accessed physical structure; and training, by the predictive system, a machine-learned model by iteratively: accessing a set of two or more candidate physical structures for the physical system; determining, by the machine-learned model, a force associated with a constituent unit in the physical system based on a relative energy associated with a plurality of neighboring positions for the constituent unit; comparing the force associated with the constituent unit determined by the machine-learned model to ground truth force data to generate a difference between the force determined by the machine-learned model to the ground truth force data; and backpropagating the difference to the machine-learned model to adjust one or more parameters of the machine-learned model.

In some embodiments, the disclosure described herein relate to a method including: accessing, by a predictive system, a set of physical structures corresponding to a physical system, each physical structure representative of a configuration of the physical system; encoding, by the predictive system, the accessed physical structures to produce a set of encoded physical structures by encoding, for each accessed physical structure, a position of each constituent unit of the physical system within the accessed physical structure; training, by the predictive system, a transformer model; and retraining, by the predictive system, the transformer model by iteratively: accessing a set of candidate physical structures for the physical system using the transformer model; determining a first energy difference between the set of candidate physical structures for the physical system, the first energy difference corresponding to a ranking of the transformer model; obtaining a second energy difference between a set of physical structures corresponding to the set of candidate physical structures using an energy function; and retraining the transformer model using the set of candidate physical structures, the first energy difference, and the second energy difference.

In some embodiments, the disclosure described herein relate to a method including: accessing, by a predictive system, a set of physical structures corresponding to one or more molecules, each physical structure representative of a conformer of the system of one or more molecules; encoding, by the predictive system, the accessed physical structures to produce a set of encoded physical structures by encoding, for each accessed physical structure, a position of each atom of the one or more molecules within the accessed physical structure; training, by the predictive system, a machine-learned model; and retraining, by the predictive system, the machine-learned model by iteratively: accessing a set of two or more candidate physical structures for the one or more molecules; determining using the machine-learned model a first energy difference among the set of candidate physical structures for the system of one or more molecules, the first energy difference corresponding to a ranking of the machine-learned model; obtaining a second energy difference between a set of physical structures corresponding to the set of candidate physical structures using a method to calculate absolute or relative reference energy values of systems of atoms and their respective coordinates; and retraining the machine-learned model using the set of candidate physical structures, the first energy difference, and the second energy difference.

In some embodiments, the disclosure described herein relate to a method, wherein encoding an accessed physical structure includes: converting one or more structural formula of one or more molecules into a sequence string representation of the one or more molecules; tokenizing the sequence string representation of the one or more molecules to produce a tokenized structural formula; tokenizing, for each atom in the one or more molecules, coordinates for the atom within the accessed physical structure to produce tokenized coordinates for the atom; and combining the tokenized structural formula and the tokenized coordinates for each atom to produce a tokenized physical structure corresponding to the accessed physical structure.

In some embodiments, the disclosure described herein relate to a method, wherein tokenizing coordinates for the atom within the accessed physical structure includes: pixelating a rendered sphere to produce a set of pixels each corresponding to a location on the surface of the rendered sphere; tokenizing, for a first atom in the one or more molecules, coordinates at a center of the sphere; and tokenizing, for each additional atom in the one or more molecules, coordinates corresponding to a pixel selected from the set of pixels based on a location of the additional atom relative to the center of a coordinate sphere.

In some embodiments, the disclosure described herein relate to a method, wherein the coordinates further correspond to a distance between the additional atom and at least one other atom in the molecule.

In some embodiments, the disclosure described herein relate to a method, wherein the sequence string representation of the molecule includes an ordered set of atoms, and wherein the coordinates for an atom include coordinates relative to the center of a coordinate sphere.

In some embodiments, the disclosure described herein relate to a method, wherein the machine-learned model is iteratively retrained until one or more retraining criteria is satisfied.

In some embodiments, the disclosure described herein relate to a method, wherein the retraining criteria is satisfied when an average difference between the first energy difference and the second energy difference for a threshold number of consecutive iterations is less than a threshold difference.

In some embodiments, the disclosure described herein relate to a method, wherein the retraining criteria is satisfied when a distribution of candidate physical structures generated over a threshold number of consecutive iterations is within a threshold difference from a Boltzmann distribution.

In some embodiments, the disclosure described herein relate to a method, wherein the retraining criteria is satisfied when performance measurement of a holdout set starts to decrease.

In some embodiments, the disclosure described herein relate to a method, wherein retraining the machine-learned model includes modifying weights of one or more layers of the machine-learned model to minimize a difference between the first energy difference and the second energy difference over subsequent iterations.

In some embodiments, the disclosure described herein relate to a method, wherein retraining the machine-learned model includes modifying weights of one or more layers of the machine-learned model by: generating a set of token sequences representing two or more physical structures; store activation outputs corresponding to the tokens in the token sequences; determining an aggregated energy state for each token sequence; and determining a backpropagated gradient based on comparing the aggregated energy states for the token sequences.

In some embodiments, the disclosure described herein relate to a method, wherein the first energy difference is determined based at least in part on a Boltzmann probability ratio between the set of candidate physical structures.

In some embodiments, the disclosure described herein relate to a method, wherein the machine-learned model is configured to: determine, for a candidate physical structure, a force associated with each atom in the one or more molecules based on an energy associated with each of a plurality of neighboring positions for the atom.

In some embodiments, the disclosure described herein relate to a method, wherein the machine-learned model is retrained based on a difference in forces associated with the candidate physical structures.

In some embodiments, the disclosure described herein relate to a method, wherein the force associated with each atom in the model is based on a collective gradient of energy associated with the plurality of neighboring positions for the atom.

In some embodiments, the disclosure described herein relate to a method, wherein a determined force associated with an atom in the one or more molecules is based on forces associated with one or more preceding atoms in the sequence string representation of the one or more molecules.

In some embodiments, the disclosure described herein relate to a method, wherein the relative energies associated with each of the plurality of neighboring positions for the atom are determined using a softmax output of the machine-learned model.

In some embodiments, the disclosure described herein relate to a method, wherein a determined force associated with an atom in the one or more molecules is based on, for each of the plurality of neighboring positions for the atom, the relative energy associated with the neighboring position and a distance between the atom and the neighboring position.

In some embodiments, the disclosure described herein relate to a method, wherein a determined force associated with an atom in the one or more molecules is based additionally on force applied from a solvent or solution on the atom in the one or more molecules.

In some embodiments, the disclosure described herein relate to a method, wherein a determined force generated by the machine-learned model associated with an atom in the one or more molecules is based additionally inherent forces in a physical system comprising the one or more molecules.

In some embodiments, the disclosure described herein relate to a method, wherein an atom in an encoded physical structure is encoded with multiple tokens. Each token represents decreasing significance of the atom's coordinates.

In some embodiments, the disclosure described herein relate to a method, further including: after the machine-learned model is retrained, generating, by the predictive system, a target probability distribution of structures for a target molecule or a portion thereof.

In some embodiments, the disclosure described herein relate to a method, further including: generating, by the predictive system, a probability distribution of structures for a system of one or more molecules.

In some embodiments, the disclosure described herein relate to a method, further including: comparing the target probability distribution and the generated probability distribution to predict a binding affinity between the target molecule or a portion thereof and another molecule.

In some embodiments, the disclosure described herein relate to a method including: accessing, by a predictive system, a set of physical structures corresponding to a system of one or more molecules, each physical structure representative of a 3D energy configuration of the system of one or more molecules; encoding, by the predictive system, the accessed physical structures to produce a set of encoded physical structures by encoding, for each accessed physical structure, a position of each atom of the one or more molecules within the accessed physical structure; training, by the predictive system, a machine-learned language model; and retraining, by the predictive system, the machine-learned language model by iteratively: accessing a set of candidate physical structures for the system of one or more molecules using the machine-learned language model; determining using the machine-learned model a first energy difference between the set of candidate physical structures for the one or more molecules, the first energy difference corresponding to a ranking of the machine-learned language model; obtaining a second energy difference between a set of physical structures corresponding to the set of candidate physical structures using a method to calculate absolute or relative reference energy values of systems of atoms and their respective coordinates, such as by using force field or quantum mechanical calculations; and retraining the machine-learned language model using the set of candidate physical structures, the first energy difference, and the second energy difference.

In some embodiments, the disclosure described herein relate to a method including: accessing, by a predictive system, a set of physical structures corresponding to a system of one or more molecules, each physical structure representative of a 3D energy configuration of the system of one or more molecules; encoding, by the predictive system, the accessed physical structures to produce a set of encoded physical structures by encoding, for each accessed physical structure, a position of each atom of the one or more molecules within the accessed physical structure; training, by the predictive system, a transformer model; and retraining, by the predictive system, the transformer model by iteratively: accessing a set of candidate physical structures for the system of one or more molecules using the transformer model; determining using the transformer model a first energy difference between the set of candidate physical structures for the system of one or more molecules, the first energy difference corresponding to a ranking of the transformer model; obtaining a second energy difference between a set of physical structures corresponding to the set of candidate physical structures using a method to calculate absolute or relative reference energy values of systems of atoms and their respective coordinates, such as by using force field or quantum mechanical calculations; and retraining the transformer model using the set of candidate physical structures, the first energy difference, and the second energy difference.

In some embodiments, the disclosure described herein relate to a method including: accessing, by a predictive system, a set of physical structures corresponding to one or more molecules, each physical structure representative of a 3D energy configuration of the system of one or more molecules; encoding, by the predictive system, the accessed physical structures to produce a set of encoded physical structures by encoding, for each accessed physical structure, a position of each atom of the one or more molecules within the accessed physical structure, wherein encoding the accessed physical structures includes: converting one or more structural formulas of the one or more molecules into a sequence string representation of the one or more molecules; tokenizing the sequence string representation of the one or more molecules to produce a tokenized structural formula; tokenizing, for each atom in the one or more molecules, coordinates for the atom within the accessed physical structure to produce tokenized coordinates for the atom; and combining the tokenized structural formula and the tokenized coordinates for each atom to produce a tokenized physical structure corresponding to the accessed physical structure; and training, by the predictive system, a machine-learned model using the encoded physical structures.

In some embodiments, a non-transitory computer-readable medium that is configured to store instructions is described. The instructions, when executed by one or more processors, cause the one or more processors to perform a process that includes steps described in the above computer-implemented methods or described in any embodiments of this disclosure. In yet another embodiment, a system may include one or more processors and a storage medium that is configured to store instructions. The instructions, when executed by one or more processors, cause the one or more processors to perform a process that includes steps described in the above computer-implemented methods or described in any embodiments of this disclosure.

BRIEF DESCRIPTION OF THE DRAWINGS

FIG. 3B is a flowchart depicting an example process for encoding a physical system, in accordance with some embodiments.

FIG. 5A is a flowchart depicting an example process for training a machine-learned model based on one or more training objectives that are related to modeling physical systems, in accordance with some embodiments.

The figures depict, and the detailed description describes, various non-limiting embodiments for purposes of illustration only.

DETAILED DESCRIPTION

The figures (FIGS.) and the following description relate to preferred embodiments by way of illustration only. One of skill in the art may recognize alternative embodiments of the structures and methods disclosed herein as viable alternatives that may be employed without departing from the principles of what is disclosed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

System Overview

Figure 1:
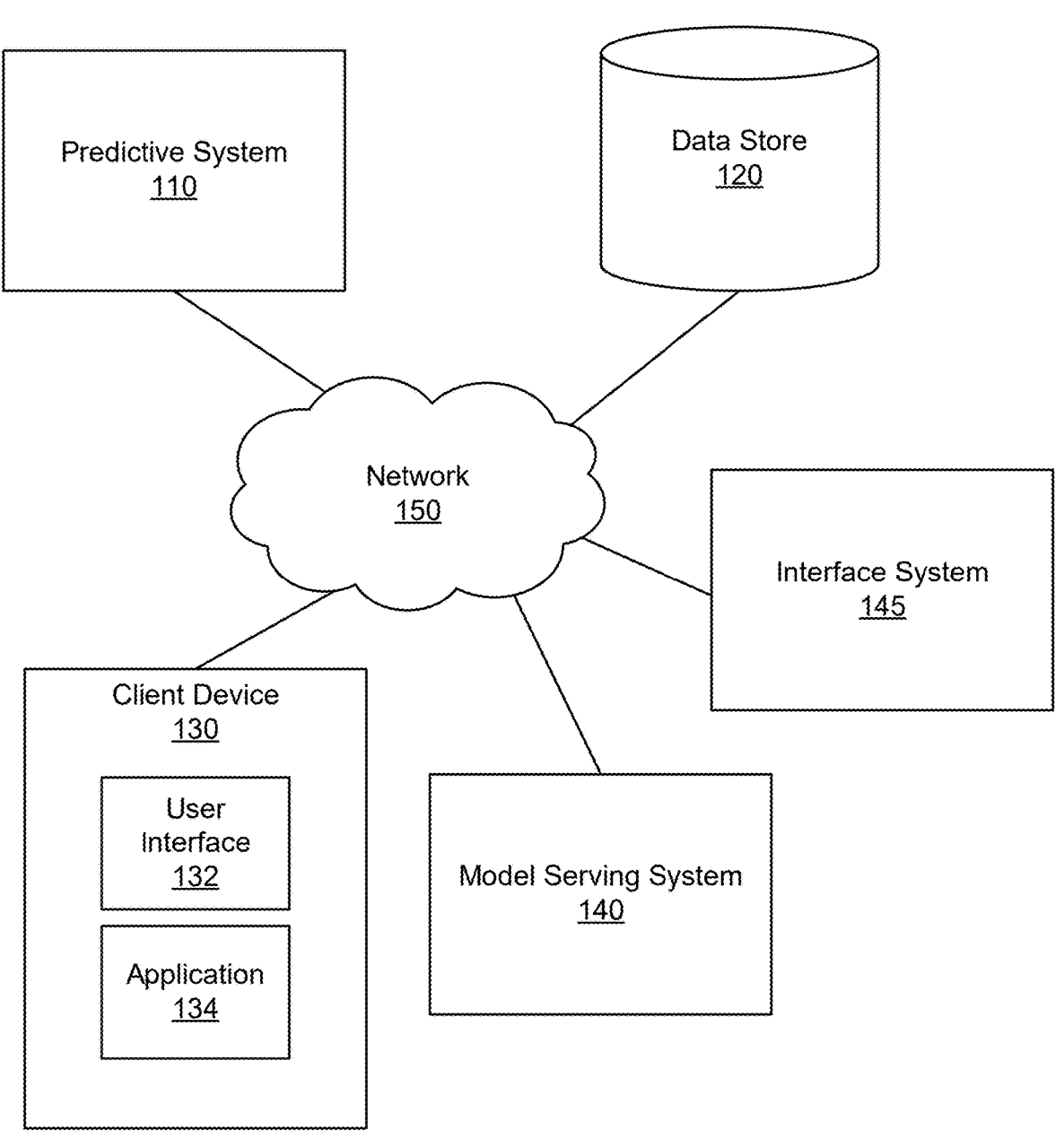
FIG. 1 is a block diagram of a system environment, in accordance with some embodiments.

FIG. 1 is a block diagram that illustrates an example of a computing environment 100 for predicting structures of physical systems, in accordance with some embodiments. By way of example, the computing environment 100 includes a predictive system 110, a data store 120, a client device 130, a model serving system 140, and an interface system 145. The entities and components in the computing environment 100 communicate with each other through network 150. In various embodiments, the computing environment 100 may include different, fewer, or additional components.

The components in the computing environment 100 may each correspond to a separate and independent entity or may be controlled by the same entity. For example, in some embodiments, the predictive system 110 may control the data store 120. In other embodiments, the predictive system 110 and the data store 120 are operated by different entities and the data store 120 provides data storage service to the predictive system 110. Likewise, in some embodiments, the predictive system 110 may control the model serving system 140. In some embodiments, the model serving system 140 may be a third party that provides pre-trained models for the predictive system 110 to use and fine-tune.

While each of the components in the computing environment 100 is sometimes described in disclosure in a singular form, the computing environment 100 may include one or more of each of the components. For example, there can be multiple client devices 130 communicating with the predictive system 110 in studying representations (e.g., simulations) of various physical systems. While a component may be described in this disclosure in a singular form, it should be understood that in various embodiments, the component may have multiple instances. Likewise, while some of the components are described in a plural form, in some embodiments the component only has a single instance in the computing environment 100.

The predictive system 110 provides predictive representations of physical structures of physical systems, predicts relative energy and physical stability of the components in the physical systems, generates data related to various parameters in the physical systems, and predicts interactions among the components in the physical systems. A predictive representation of a physical system may be a sampled state of the physical system that is dynamically changing. For example, a predictive representation may be a snapshot of a physical system. Sampling may be performed to draw independent and identically distributed samples from the simulation for further analysis. The predictive system 110 trains and re-trains one or more machine-learned models that predict physical structures corresponding to physical systems. Each physical structure is representative of a spatial configuration (e.g., a conformer) of constituent units relative to each other and the corresponding relative energy. The predictive system 110 may receive inputs in the form of sequences or other suitable descriptions of physical systems and apply the machine-learned models to generate predictions of the physical structures of the physical systems.

In various embodiments, the predictive system 110 may take different suitable forms. For example, while the predictive system 110 is described in a singular form, the predictive system 110 may include one or more computers that operate independently, cooperatively, and/or distributively. In some embodiments, the predictive system 110 may be a server computer that includes one or more processors (e.g., graphics processing units (GPU), tensor processing units (TPU), other any suitable AI processors that accelerate the computations related to machine learning models) and memory that stores code instructions that are executed by one or more processors to perform various processes described herein. In some embodiments, the predictive system 110 may also be referred to as a computing device or a computing server. In some embodiments, the predictive system 110 may be a pool of computing devices that may be located at the same geographical location (e.g., a server room) or be distributed geographically (e.g., cloud computing, distributed computing, or in a virtual server network). In some embodiments, the predictive system 110 may be a collection of servers that independently, cooperatively, and/or distributively provide various products and services described in this disclosure. The predictive system 110 may also include one or more virtualization instances such as a container, a virtual machine, a virtual private server, a virtual kernel, or another suitable virtualization instance. In some embodiments, the predictive system 110 may provide client devices 130 with various predictive representation tools and machine-learned models as a form of cloud-based software, such as software as a service (SaaS) through the network 150. In some situations, the predictive system 110 may also refer to the entity that operates the predictive system 110.

The computing environment 100 may include various data stores 120 that store different types of data for different entities. For example, the predictive system 110 may store weights of trained models in a data store 120. The predictive system 110 may also store, in a data store 120, various physical and chemical parameters of components involved in various physical systems, including energy data such as free energy at a range of conditions, force data, physical parameters, entropy changes in physical processes, and other suitable parameters that can be used to model physical systems. The predictive system 110 may also store, in a data store 120, a database of known physical systems and their corresponding parameters. The database may include sequences of molecules, physical and chemical properties of the molecules, and known interactions of the molecules with other agents. In some embodiments, the predictive system 110 may further store physical configuration data of various physical systems, including coordinate information and angles between one unit to another. The predictive system 110 may further store experimental data related to various physical systems, including relative energy values measured under different conditions, different measured conformations and relative energy and entropy differences between those conformations, and force field data. A client device 130 may also store various data specific to a client in a data store 120. The data may include parameters of the physical systems being simulated, target physical systems, and experimental data.

A data store 120 includes one or more storage units, such as memory, that take the form of a non-transitory and non-volatile computer storage medium to store various data. The computer-readable storage medium is a medium that does not include a transitory medium, such as a propagating signal or a carrier wave. In one embodiment, the data store 120 communicates with other components by the network 150. This type of data store 120 may be referred to as a cloud storage server. Examples of cloud storage service providers may include AMAZON AWS, DROPBOX, RACKSPACE CLOUD FILES, AZURE, GOOGLE CLOUD STORAGE, etc. In some embodiments, instead of a cloud storage server, a data store 120 may be a storage device that is controlled and connected to the predictive system 110. For example, the data store 120 may take the form of memory (e.g., hard drives, flash memory, discs, ROMs, etc.) used by the predictive system 110, such as storage devices in a storage server room that is operated by the predictive system 110.

A client device 130 may also be referred to as a user device. A client device 130 may be controlled by a user of the predictive system 110. The client device 130 may be any computing device. Examples of client devices 130 include personal computers (PC), desktop computers, laptop computers, tablet computers, smartphones, wearable electronic devices such as smartwatches, or any other suitable electronic devices.

A client device 130 may include a user interface 132 and an application 134. The user interface 132 may be the interface of the application 134 and allow the user to perform various actions associated with application 134. For example, application 134 may be a software application, and the user interface 132 may be the front end. The user interface 132 may take different forms. In some embodiments, the user interface 132 is a graphical user interface (GUI) of a software application. For example, the predictive system 110 may provide predictive representation software that can display various physical structures. In some embodiments, the front-end software application is a software application that can be downloaded and installed on a client device 130 via, for example, an application store (App store) of the client device 130. In some embodiments, the front-end software application takes the form of a webpage interface that allows users to perform actions through web browsers. A front-end software application includes a GUI that displays various information and graphical elements. In some embodiments, the GUI may be the web interface of a software-as-a-service (SaaS) platform that is rendered by a web browser. In some embodiments, user interface 132 does not include graphical elements but communicates with a server or a node via other suitable ways, such as command windows or application program interfaces (APIs).

In computing environment 100, the predictive system 110 may operate one or more applications 134 that interact with client devices 130. The application 134 may be hosted on the Cloud and controlled by the predictive system 110 or may be installed on a client device 130. In various embodiments, the predictive system 110 operates different types of applications 134, including a predictive representation tool, a machine-learned tool that predicts affinity between two molecules, a ranking and filtering tool that identifies candidate molecules, and a drug discovery tool. These are merely examples of various types of applications 134 that may be operated on a client device 130. In some embodiments, functionalities of those tools may be combined as a single application 134.

A model serving system 140 is a system that provides machine-learned models. The model serving system 140 may receive requests from the predictive system 110 to perform tasks using machine-learned models. The tasks may include, but are not limited to, predictive representation of physical systems, natural language processing (NLP) tasks, audio processing tasks, image processing tasks, video processing tasks, etc. In some embodiments, the machine-learned models deployed by the model serving system 140 are models that are originally trained to perform one or more NLP tasks but are fine-tuned for other specific tasks. The NLP tasks include, but are not limited to, text generation, query processing, machine translation, chatbots, and the like. The fine-tuned tasks may or may not be language-related. For example, in some embodiments, one or more models are trained to perform tasks that are not language-related, such as predictive representation of physical systems, predicting affinity between two molecules, and selection of molecular candidates relative to a target.

The model serving system 140 may receive a request including input data (e.g., sequence data of one or more molecules) and encode the input data into one or more input tokens. The model serving system 140 applies a machine-learned model to generate a set of output tokens. Each token in the set of input tokens or the set of output tokens may correspond to a coordinate value of a constituent unit in a physical system. In some embodiments, each constituent unit is encoded by a single token. In some embodiments, each constituent unit is encoded by multiple tokens. Each token representing decreasing significance of the constituent unit's coordinates (e.g., atom's coordinates). For example, in a set of tokens, the first token may represent the most significant bits of the coordinates of the constituent unit. The second token may represent less significant bits in the coordinates. The set of tokens may correspond to an atom, a functional group, an amino acid, a nucleotide, a covalent bond, an ionic bond, a non-covalent interaction, or another physical or chemical force. In some embodiments, the model is a language model but is trained to tokenize a physical system. The language model may receive a sequence of one or more input tokens that represent a query of a physical system and generate a sequence of output tokens that represent a predicted physical structure of the queried physical system. In some embodiments, the model predicts the next token in a physical system in an autoregressive manner.

In some embodiments, the sequence of input tokens or output tokens is arranged as a tensor with one or more dimensions, for example, one dimension, two dimensions, or three dimensions. For example, one dimension of the tensor may represent the number of tokens (e.g., length of a sequence), one dimension of the tensor may represent the physical coordinates of a constituent unit, one dimension of the sensor may represent an angle between two constituent units, and one dimension of the tensor may represent a space in an embedding space. The input data or the output data may be configured as any number of appropriate dimensions depending on the physical systems. In some embodiments, one or more dimensions are latent features learned in the deep layers of a machine-learned model and do not correspond individually to a real-world concept.

The machine-learned models served by the model serving system 140 may take different model structures. In some embodiments, one or more models are configured to have a transformer neural network architecture. Specifically, the transformer model is coupled to receive sequential data tokenized into a sequence of input tokens and generates a sequence of output tokens depending on the task to be performed. Transformer models are examples of language models that may or may not be auto-regressive. In some embodiments, the language models may have the architecture of a language model but are trained or re-trained to perform predictive representations of physical systems.

In some embodiments, the language models are large language models (LLMs) that are trained on a large corpus of training data to generate outputs. An LLM may be trained on massive amounts of training data, often involving billions of words or text units, and may be fine-tuned by training data of molecular conformations. An LLM may have a significant number of parameters in a deep neural network (e.g., transformer architecture), for example, at least 1 billion, at least 15 billion, at least 135 billion, at least 175 billion, at least 500 billion, at least 1 trillion, at least 1.5 trillion parameters.

Since an LLM has a significant parameter size and the amount of computational power for inference or training the LLM is high, the LLM may be deployed on an infrastructure configured with, for example, supercomputers that provide enhanced computing capability (e.g., graphic processor units) for training or deploying deep neural network models. In one instance, the LLM may be trained and deployed or hosted on a cloud infrastructure service. The LLM may be pre-trained by the model serving system 140. In some embodiments, the LLM may also be fine-tuned by the model serving system 140 or by the predictive system 110. An LLM may be trained on a large amount of data from various data sources. For example, the data sources include websites, articles, posts on the web, and the like. From this massive amount of data coupled with the computing power of LLM, the LLM is able to perform various tasks and synthesize and formulate output responses based on information extracted from the training data.

In some embodiments, when the machine-learned model including the LLM is a transformer-based architecture, the transformer has a generative pre-training (GPT) architecture including a set of decoders that each perform one or more operations to input data to the respective decoder. A decoder may include an attention operation that generates keys, queries, and values from the input data to the decoder to generate an attention output. In one or more other embodiments, the transformer architecture may have an encoder-decoder architecture and includes a set of encoders coupled to a set of decoders. An encoder or decoder may include one or more attention operations.

While an LLM with specific layer architecture is described as an example in this disclosure, the language model can be configured as any other appropriate architecture including, but not limited to, long short-term memory (LSTM) networks, Markov networks, Bidirectional Encoder Representations from Transformers (BERT), generative-adversarial networks (GAN), diffusion models (e.g., Diffusion-LM), and the like. A machine-learned model may be implemented using any suitable software package, such as PyTorch, TensorFlow, Mamba, Keras, etc.

In various embodiments, the model serving system 140 may or may not be operated by the predictive system 110. In some embodiments, the model serving system 140 is a sub-server or a sub-module of the predictive system 110 for hosting one or more machine-learned models. In such cases, the predictive system 110 is considered to be hosting and operating one or more machine-learned models. In some embodiments, a model serving system 140 is operated by a third party such as a model developer that provides access to one or more models through API access for inference and fine-tuning. For example, the model serving system 140 may be provided by a frontier model developer that trains a large language model that is available for the predictive system 110 to be fine-tuned to be used in the context of simulating physical systems.

In some embodiments, the task for the model serving system 140 may be based on knowledge of the predictive system 110 that is fed to the machine-learned model of the model serving system 140, rather than relying on general knowledge encoded in the model weights of the model. Thus, one objective may be to perform various types of predictive representation tasks based on external data such as experimental data and laboratory measurements in order to simulate the physical system. The external data may also be a library of candidate molecules with corresponding data that are used in screening in molecule discovery.

In some embodiments, the predictive system 110 is connected to an interface system 145. The interface system 145 receives external data from the predictive system 110 and builds a structured index over the external data using, for example, another machine-learned language model or heuristics. The interface system 145 receives one or more queries from the predictive system 110 on the external data. Using the structured index over the external data, the interface system 145 obtains one or more responses from the model serving system 140 and synthesizes a response to the query on the external data. While the predictive system 110 can directly generate a prompt using the external data as context, oftentimes, the amount of information in the external data exceeds token limitations allowed by the machine-learned language model. interface system 145 can resolve token limitations by generating a structured index of the external data and offering data connectors to external data sources.

The communications among the predictive system 110, a data store 120, a client device 130, a model serving system 140, and an interface system 145 may be transmitted via a network 150. In some situations, a network 150 may be a local network. In some situations, a network 150 may be a public network such as the Internet. In one embodiment, the network 150 uses standard communications technologies and/or protocols. Thus, the network 150 can include links using technologies such as Ethernet, 802.11, worldwide interoperability for microwave access (WiMAX), 3G, 4G, LTE, 5G, digital subscriber line (DSL), asynchronous transfer mode (ATM), InfiniBand, PCI Express Advanced Switching, etc. Similarly, the networking protocols used on the network 150 can include multiprotocol label switching (MPLS), the transmission control protocol/Internet protocol (TCP/IP), the User Datagram Protocol (UDP), the hypertext transport protocol (HTTP), the simple mail transfer protocol (SMTP), the file transfer protocol (FTP), etc. The data exchanged over the network 150 can be represented using technologies and/or formats, including the hypertext markup language (HTML), the extensible markup language (XML), etc. In addition, all or some of the links can be encrypted using conventional encryption technologies such as secure sockets layer (SSL), transport layer security (TLS), virtual private networks (VPNs), Internet Protocol security (IPsec), etc. The network 150 also includes links and packet-switching networks such as the Internet.

Predictive System

Figure 2:
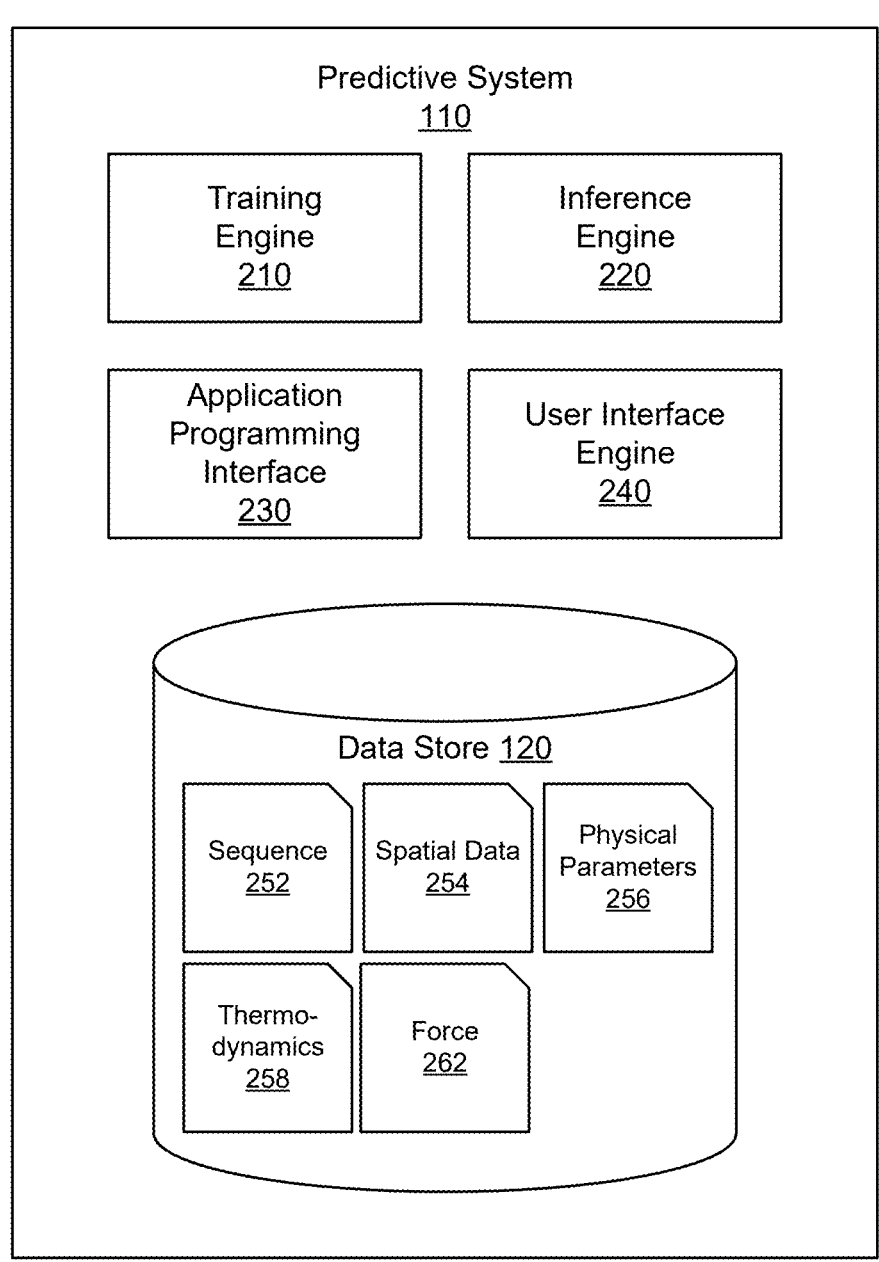
FIG. 2 is a block diagram illustrating an example predictive system, in accordance with some embodiments.

FIG. 2 is a block diagram illustrating an example predictive system 110, in accordance with some embodiments. In some embodiments, a predictive system 110 may include a training engine 210, an inference engine 220, an application programming interface 230, a user interface engine 240, and a data store 120. In various embodiments, the predictive system 110 may include additional, fewer, or different components. The functionalities described in various components may also be distributed in a different manner among the components.

A training engine 210 may manage the training and re-training of one or more machine-learned models used for the predictive representation of physical systems. The training engine 210 may determine model architecture, select training sets, and define training objectives. The training engine 210 may also define the end condition in training, such as by setting the number of epochs or a convergence criterion to determine an end point of the training. In some embodiments, the training engine 210 may also fine-tune domain-specific and/or objective-specific models that are fine-tuned for clients. For example, one client of the predictive system 110 may be in the study of small molecule interaction. The training engine 210 may use a set of small molecule training samples to fine-tune a first machine-learned model. In another instance, another client of the predictive system 110 may be in the study of the tertiary structures of proteins. The training engine 210 may use a set of protein structure training samples to fine-tune a second machine-learned model.

The training engine 210 may determine the model architecture. In some embodiments, the machine-learned models for simulating physical structures of physical systems may use the architecture of a language model, such as a transformer model. Additionally, or alternatively, the machine-learned model may include the architecture with attention mechanisms. While a transformer model includes the attention mechanism, some other model architecture that is attention-based may also be used. Additionally, or alternatively, the machine-learned model may be token-based and auto-regressive. For example, a decoder-based transformer model may be used to predict the next token in an auto-regressive manner. Additionally, or alternatively, certain parts of the machine-learned model are bi-directional such as in an encoder portion. In some embodiments, the machine-learned model is a decoder-only model. In some embodiments, the machine-learned model may take the form of a diffusion model. In various embodiments, depending on the model type and architecture, the machine-learned model may be referred to as a language model, a transformer model, an attention-based model, a token-based model, an auto-regressive model, an energy-based model, a force-field model, a Boltzmann generator or any combination of these models.

In some embodiments, the training engine 210 may determine how training and re-training are performed. For example, the machine-learned model may be trained using training samples related to physical systems. In some embodiments, the transformer model may first be trained as a language model using textual training samples and be re-trained by training samples that model physical systems. Re-training may include further training of a machine-learned model, such as in epochs subsequent to the initial epoch that is considered as the initial training. Re-training may also include re-training in a trained model, such as in further training that is performed in response to additional data being generated. Re-training may also include fine-tuning a pre-trained model. The pre-trained model may be a language model that is trained by textual training data or a model that is trained by physical system data. In some cases, fine-tuning may also be considered as part of transfer training. For example, fine-tuning allows a language model to be trained as a predictive representation model with a relatively smaller set of training data related to physical systems. In some embodiments, fine-tuning may also be performed to further tailor a predictive representation model to a particular downstream application. For example, RNA training samples may be used to fine-tune a trained predictive representation model to specialize in predicting RNA structures. Small molecule affinity to proteins may be used to fine-tune a small molecule discovery model relative to protein targets.

In some embodiments, the training engine 210 may also customize one or more layers in a machine-learned model, such as activation functions of various layers in a model. By way of example, a machine-learned model that is used to predict the physical conformation of a system of one or more molecules may have a softmax layer that maps the selection of tokens to a probability distribution. The probability distribution generated by the machine-learned model may be compared with common distributions that are used to model physical systems, such as the Boltzmann distribution used to model a system of one or more molecules, or another suitable distribution such as a Fermi-Dirac distribution, a Bose-Einstein distribution, a Gaussian distribution, a Poisson distribution, a Gibbs distribution, a Rayleigh distribution, etc. In specifying how a machine-learned model selects the next token, the training engine 210 may specify that the token selection should be determined based on the weights of the model to generate a physical structure that is compatible with the conformational distribution measured in an actual physical system.

The training engine 210 may also specify one or more training objectives in training or re-training a machine-learned model. In some embodiments, the training objectives may be implemented as one or more loss functions that are used in gradient descent. In some embodiments, the training objectives for a predictive representation model may be energy-based or force-based. In an energy-based training objective, in forward propagation, the machine-learned model may generate sequences of output tokens that represent a set of two or more physical structures representative of various conformations of a physical system. Each sequence may represent one of the physical structures. As part of a loss function, the training engine 210 may determine the energy difference in the set of physical structures based on the structures' respective probabilities and compare the energy difference to the energy value of the ground truth recorded in the training samples. In some embodiments, the energy difference may be determined based on variance of a set of sampled physical structures which include model-generated structures and structures from the ground truth. Based on the loss function, the training engine 210 determines the gradient values of various parameters using gradient descent to backpropagate the gradients to update the weights of the model.

Alternatively, or additionally, the training objective may also be force-based. For one or more tokens representing a constituent unit such as an atom, in forward propagation, the training engine 210 may determine the coordinates of the atom and the relative energy values in various coordinates around the atom. In turn, the training engine 210 may determine the negative gradient of the energy values, which is the force exerted on the constituent unit. For example, the gradient of the energy values can be determined using finite difference gradients. The force predicted in forward propagation is used to compare the force field value in the ground truth data. By comparing the force difference as part of a loss function, the training engine 210 determines the gradient values of various parameters using gradient descent to backpropagate the gradients to update the weights of the model. In some embodiments, by using force field data, the training engine 210 can apply the theory of Boltzmann generators and train a machine-learned model as a Boltzmann generator.

An inference engine 220 may manage a trained machine-learned model to perform various predictive representation tasks (e.g., simulations). For example, a client may provide the predictive system 110 with a molecular sequence for the machine-learned model to generate a predictive representation of a set of physical structures of the molecule given certain physical conditions such as temperature, pressure, and solvent. In some embodiments, the inference engine 220 may select one of the fine-tuned models to perform a client-specific task. For example, a client may perform one or more drug discovery tasks that are related to generating a de novo small molecule that is predicted to bind to a target protein. The inference engine 220 may select a model that is specialized in generating a sequence of a new small molecule.

The application programming interface (API) 230 provides various application communication interfaces for the predictive system 110 to communicate with other systems, including with a client device 130 and a model serving system 140. For example, a client device 130 may invoke one or more machine-learned models that are operated by the predictive system 110 through the API. API may be in compliance with any common API standards such as Representational State Transfer (REST), query-based API, Webhooks, etc. The data transferred through the API may be in formats such as JSON and XML.

The user interface engine 240 may be a software application interface that is provided and operated by the predictive system 110. For example, the predictive system 110 may provide a predictive representation tool for a client to design and study the properties of a physical system such as a system of one or more molecules. The predictive system 110 may also provide visualizations of conformations, relative energies, and properties of a particular molecule.

The user interface engine 240 may take different forms. In one embodiment, the user interface engine 240 may control or be in communication with an application that is installed in a client device 130. For example, the application may be a cloud-based SaaS or a software application that can be downloaded in an application store (e.g., APPLE APP STORE, ANDROID STORE). The user interface engine 240 may be a front-end software application that can be installed, run, and/or displayed on a client device 130. The user interface engine 240 also may take the form of a webpage interface of the predictive system 110 to allow clients to access data and results through web browsers. In some embodiments, the user interface engine 240 may not include graphical elements but may provide other ways to communicate, such as through APIs 230.

A predictive system 110 may include a data store 120 or may be connected to a data store 120. A data store 120 may store various types of data that can be used to train or re-train a machine-learned model and be used as part of inputs in making inference. The various types of data stored in the data store 120 may be extracted as features and converted to latent embeddings for use in a machine-learned model. Examples of data that are stored in a data store 120 include sequence data 252, spatial data 254, physical and chemical parameters 256, thermodynamics data 258, and force data 262.

Sequence data 252 may include sequences that represent physical systems such as molecules, isotopes, nucleic acids, peptides, proteins, metabolites, enzymes, coenzymes, cofactors, nanoparticles, polymers, composites, and other suitable physical systems. A sequence may be a string of constituent units that are described by text. The constituent units can include the physical units in the system (e.g., atoms in a molecule or amino acids in a protein) and the interactions among the physical units (e.g., bonds, forces, etc.). The sequences may be represented and stored in various suitable formats. For example, for molecules, the sequences may be represented in simplified molecular-input line-entry system (SMILES), Self-Referencing Embedded Strings (SELFIES), International Chemical Identifier (InChI), SMILES Reaction Transform Language (SMIRKS), SMILES arbitrary target specification (SMARTS), Chemical Markup Language (CML), etc. Nucleic acids may be represented by a sequence of nucleotides. Peptides and proteins may be represented by a sequence of amino acid symbols. Other physical systems may be represented using any suitable standardized formats that are commonly used. In some embodiments, the predictive system 110 may receive a sequence in a particular format and normalize the sequence to another format that is commonly used in the data store 120. In some embodiments, the normalized format may be one of the common formats or may also be a customized format used by the predictive system 110. For example, as further discussed below regarding encoding a physical system, the predictive system 110 may train an encoder model that is used to encode a sequence in a common format to a tokenized sequence and use the encoded tokenized sequence as the sequence format for the data store 120.

The spatial data 254 are records of spatial isomerism data of constituent units in one or more physical configurations such as conformers. The spatial data may be measured in the laboratory or obtained by computational models, such as molecular dynamics simulations, or quantum mechanical calculations. Spatial data can be relative to various conditions such as temperature, pressure, density, acidity, and solvent. Given a set of conditions, a physical system may include multiple conformers, each of which may correspond to a different set of three-dimensional orientations of their constituent units in space. The spatial data 254 may include any data for physical systems in spatial isomerism. The spatial data 254 for a physical structure may include spatial coordinates of the constituent units, angles, and distances between constituent units, surface topology, volumetric measurements, surface normals, point cloud data, and three-dimensional shape descriptors. The angles may include backbone torsions angles in aminoacids, peptides, or proteins.

The spatial coordinates may be recorded using one or more suitable coordinate systems. In some embodiments, the predictive system 110 may use a spherical hierarchical coordinate system. By way of example, in a physical system that corresponds to a molecule or one or more molecules, the predictive system 110 records the atoms of the molecule in 3-dimensional space by coordinates relative to a global reference frame. In some embodiments, the predictive system 110 may pixelize a sphere around an atom so that the coordinates may be discretized. By way of example, the predictive system 110 may define an origin and a reference frame relative to the origin based on three or more points. The first point may be defined at the origin. The first point may correspond to a first atom. The second point may be defined on the x-axis encoding a distance from the origin. The second point may correspond to a second atom. The third point may be defined on the xy plane encoding two distances from the origin. The third point may correspond to a third atom. After a reference frame is created by encoding the three points, subsequent points corresponding to various atoms may be represented by pixels on a sphere and distances from the origin. Each pixel that represents an atom may be represented with a hierarchical representation at a distance from the origin. In some embodiments, other types of coordinate systems may be used, such as Cartesian coordinate system, xyz coordinate system, octree coordinate system, polar coordinate system, cylindrical coordinate system, barycentric coordinate system, etc.

In some embodiments, in addition to or alternative to a spherical hierarchical coordinate system, an octree coordinate system may be used in the spatial data 254. An octree coordinate system is a hierarchical spatial partitioning structure used to manage and organize 3D space by recursively subdividing it into smaller cubic volumes. At the highest level, the entire 3D space is represented by a single cubic volume, known as the root node. This root node is then divided into eight smaller cubic regions, or octants, each representing a sub-volume of the space. Each of these octants can be further subdivided into eight smaller cubic regions, creating a tree-like structure where each node represents a cubic volume and each branch represents the subdivision into smaller octants. This recursive subdivision continues until a desired level of detail or a specific condition is met, resulting in a multi-level tree structure.

Physical and chemical parameters 256 include the physical and chemical properties of a physical system. For example, in the case of a physical system being a molecule or one or more molecules, physical parameters include a variety of measurable properties that describe the physical characteristics of those molecules. These parameters encompass molecular weight, appearance, odor, density, solubility in water and in other solvents, partition coefficient, vapor pressure, UV spectrum, and viscosity. The parameters may also include bond lengths and bond angles that define the distances between atoms and the angles formed by these bonds, respectively. The dipole moment measures the separation of electric charge within the molecule. Additionally, parameters such as boiling point, melting point, and solubility provide insight into the molecule's phase transitions and interactions with solvents. Spectroscopic properties that characterize molecular structure and dynamics may also be part of the properties that are stored in the data store 120. The data store 120 may also store chemical properties. The chemical properties may include a range of properties that determine the chemical behavior and reactivity of a molecule. These parameters encompass structural expressions such as structural formulas, molecular formulas, functional groups, Chemical Abstracts Service (CAS) numbers, molecular geometry, dipole moment, etc. The chemical properties may also include chemical reactivity, which describes how a molecule interacts with other substances, including reaction rates and mechanisms. The chemical properties may include acidity and basicity, quantified by pKa values, and redox potential that measures the oxidation state. The chemical properties may also include binding affinity data (e.g. IC50, binding free energy, on- and off-rates), and data corresponding to a molecule's ADMET properties (e.g. permeability, metabolic stability, or half-life). In some embodiments, the data store 120 may also store parameters such as electrophilicity and nucleophilicity to describe the molecule's affinity for electron-rich or electron-poor sites.

Thermodynamics data 258 are data related to the thermodynamics of physical systems, which may include parameters such as heat capacity, standard molar entropy that measures the entropy content of a physical system, Gibbs free energy, Helmholtz free energy, standard enthalpy of formation, standard enthalpy of combustion, etc. In some embodiments, for a given physical system, the data store 120 may include various distribution data related to entropy and potential energy profile, such as the Boltzmann distribution. By way of example, the data store 120 may store the probability distribution of configurations (e.g., conformers) in various energy states in thermal equilibrium. The entropy of a conformer in a physical system can be expressed using Boltzmann's entropy formula. The Boltzmann distribution gives the probability of a physical system being in a particular energy state. In some embodiments, the data store 120 may store the entropy data, which may correspond to a measure of the number of physical conformers that can be measured in equilibrium. The data store 120 may also store distribution data that correspond to the relative energy values of those conformers in equilibrium. The distribution data may correspond to Boltzmann distribution data, or another suitable distribution, such as Gibbs distribution, Fermi-Dirac distribution, and Bose-Einstein distribution.

Force data 262 are data related to parameters that are used to simulate potential energy to a physical system, such as force field data, quantum mechanics, density functional theory (DFT) energies and forces, as well as molecular mechanics, ab initio calculations, semi-empirical methods, empirical potential functions, electrostatic potential, and potential energy surfaces. In the case where a physical system is a molecule or one or more molecules, the force data may be stored in the data store 120 as derivatives of the relative energy values of constituent units over the spatial coordinate system used in the spatial data 254. The predictive system 110 may use the force data to simulate the relative energies and forces acting on atoms as part of the input or training objectives in training a machine-learned model to predict the structure, dynamics, and thermodynamic properties of the system. The force data may include data that describe covalent bonds, such as bond stretching, angle bending, torsion, etc. The force data may also include data that describe non-bonding interactions such as Van der Waals forces, ionic interactions, and electrostatic interactions. In some embodiments, for each constituent unit in a physical system, the predictive system 110 may determine the estimated coordinates of the unit and the relative energy value of the unit. In turn, the predictive system 110 may determine the derivative of the relative energy value over the spatial area to determine the force data. The force data of known molecules may be stored in the data store 120 as the ground truth used in the loss function for training a machine-learned model.

Example Encoding Process

Figure 3A:
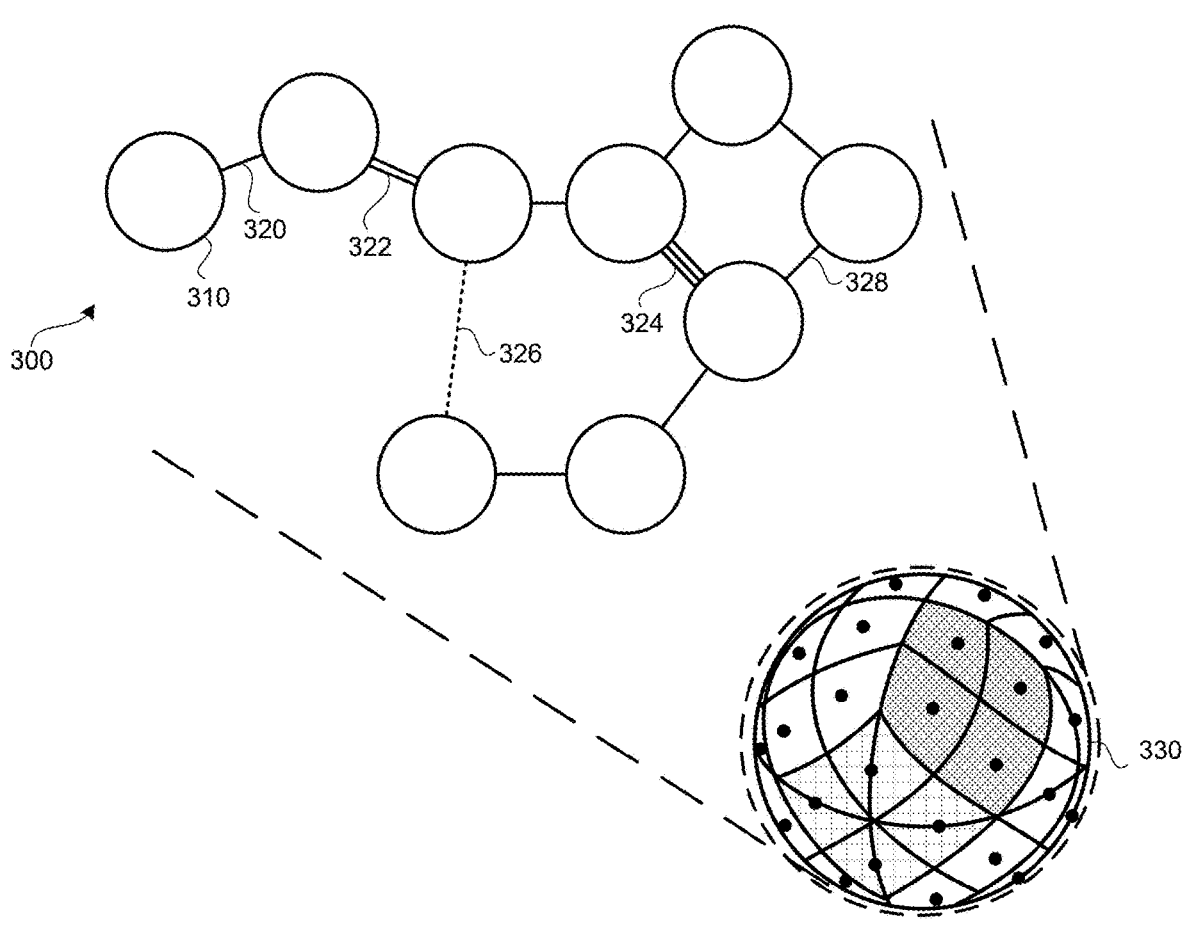
FIG. 3A is a conceptual diagram illustrating a physical system and an encoding process that encodes various physical structures of the physical system, in accordance with some embodiments.

FIG. 3A is a conceptual diagram illustrating a physical system 300 and an encoding process that encodes various physical structures of the physical system 300, in accordance with some embodiments.

In some embodiments, a physical system 300 may be referred to as a collection of constituent units 310 that interact with each other. In FIG. 3A, the constituent units 310 are represented as nodes and the interactions among the constituent units 310 are represented as edges. The physical system 300 may include one or more molecules. In the case of a single molecule, the constituent units 310 may be individual atoms, but in some cases, an individual unit 310 may also correspond to a group of atoms such as a function group, a nucleic acid, an amino acid, etc. A physical system 300 may also include two or more molecules. For example, a machine-learned model may be used to model the potential affinity between a candidate molecule (e.g. a ligand) and a target molecule. The target molecule can be a small molecule, a macromolecule (e.g., carbohydrate, lipid, protein, nucleic acid) or a combination thereof. The candidate molecule (e.g., a ligand) can be a small molecule, a macromolecule (e.g., carbohydrate, lipid, protein, nucleic acid) or a combination thereof. In some embodiments, the candidate molecule is a therapeutic agent and the target molecule is a biological target of the therapeutic agent. The two molecules may be represented in the same system 300. The constituent units 310 can still be atoms of the two molecules and the interactions between the two molecules may be encoded as edges.

In some embodiments, depending on situations, the constituent units 310 may also be in different granularity. For example, a protein can be a physical system 300. The constituent units 310 in the protein may be individual amino acid units or carbon alpha atoms and other atoms in the protein. In some embodiments, the machine-learned model can be trained with amino acid sequences and 3D coordinates of carbon alpha atoms in the training sample and used to predict protein structures of another amino acid sequence that is not in the training sample. In some embodiments, the physical system 300 may represent the entire protein or may represent the protein backbone structure. In some embodiments, some of the units in the physical system 300 may also be omitted in encoding the constituent units 310. For example, in certain organic molecules, one approach is to encode every atom in a molecule. Another approach is to skip encoding some of the hydrogen atoms.

In some embodiments, the constituent units 310 within a physical system 300 can be of different types. For example, while a constituent unit 310 in a portion of the molecule may correspond to an individual atom, in another portion of the molecule a constituent unit 310 may correspond to a functional group or a group of atoms. The decision on how to encode constituent unit 310 may be determined manually by users based on design choices or may be determined automatically through training and the inference process of a machine-learned model. For example, the machine-learned model, through the inference process, may automatically determine that two or more atoms should be encoded as a single constituent unit 310.

The edges in the physical system 300 represent the interactions between the constituent units 310. The interactions may include bonded interactions, such as single covalent bonds, double covalent bonds, triple covalent bonds, ionic bonds, metallic bonds, etc. For example, the edges 320, 322, and 324 represent different types of covalent bonds in a physical system 300. The interactions may also include other interactions, such as Van der Waals forces, London dispersion forces, dipole interactions, etc. For example, the dash-lined edge 326 represents a non-bonded interaction between two constituent units 310. In some situations, a group of constituent units 310 may form a specific subsystem such as a group of cyclic nodes. The bonds, such as the edge 328, in those specific groups may also be encoded differently. For example, in a benzene ring, the bonds are encoded differently than a single bond or a double bond. In some embodiments, bonds between different atoms may also be encoded differently. For example, a single C—H bond is encoded differently from a single C—O bond.

The nodes and edges in a physical structure of physical system 300 may be encoded relative to a coordinate system. The coordinate system may be any suitable coordinate systems that are discussed in spatial data 254 in conjunction with FIG. 2. For example, the coordinate system is a spherical hierarchical coordinate system discussed in FIG. 2. The spherical hierarchical coordinate is conceptually represented in inset 330, which defines the space of the physical system 300 as a sphere with a reference origin. The reference origin may be the center of a constituent unit 310 or may be any reference point in the physical system 300. The sphere can be pixelated so that the coordinates of the constituent units 310 can be discretized. The constituent units 310 may be represented in the coordinate system relative to the reference origin. The edges in the physical system 300 may include data such as angle data relative to one or more constituent units 310, length data, and other coordinate data.

In some embodiments, different physical structures of the same physical system 300 are encoded differently. Some of the physical systems 300 have 3D structural portions that rotate relative to each other, such as through a dihedral angle on a portion of the system. In the case where a physical system 300 is a molecule or one or more molecules, the same molecule in a physical system 300 may exhibit a plurality of physical conformers that are interchangeable with each other according to a Boltzmann distribution modeling the physical system 300. In such a case, each physical conformer can have a different set of encoded tokens to represent the physical conformers. In some embodiments, due to rotations, interactions, and other reasons, the same bond between two atoms in different conformers can have different angles, lengths, dipole moments, etc. As such, the same bond may be encoded differently in various conformers. Likewise, the same constituent unit 310 in two conformers may be encoded differently.

FIG. 3B is a flowchart depicting an example process 350 for encoding a physical system, in accordance with some embodiments. In various embodiments, the process 350 may include additional, fewer, or different steps than those described in conjunction with FIG. 3B. In some embodiments, the steps of the process 350 may be performed in different orders than the order described in conjunction with FIG. 3B. The process 350 may be carried out by the predictive system 110 or a machine-learned model. For simplicity, the process 350 is described as the predictive system 110 performing certain steps, even though some steps may be performed by other components such as by the predictive system 110 causing a machine-learned model to perform the steps. In addition to illustrating the process 350, FIG. 3A is a conceptual diagram that illustrates the process 350. FIG. 3B is described in conjunction with FIG. 3A.

Referring both to FIG. 3A and FIG. 3B, in some embodiments, the predictive system 110 converts 360 a physical system 300 into a sequence string 340 that represents the physical system 300. For example, in the case of a molecule or one or more molecules, the predictive system 110 may convert one or more structural formulas of the one or more molecules into a SMILES representation of the molecule(s). In some embodiments, the sequence string 340 represents an ordered set of constituent units 310. For example, the SMILES representation of the molecule is an ordered set of atoms. In some embodiments, since the sequence string 340 representing the physical system 300 is a text string, the sequence string 340 can be used as an input, such as part of a natural language prompt, in a machine-learned language model. While SMILES is used as an example of the sequence string 340, other types of sequence formats that are discussed in the sequence data 252 may also be used.

In some embodiments, the predictive system 110 tokenizes 362 the sequence string 340 of the physical system 300 to produce a tokenized sequence. For example, in the case of a molecule or one or more molecules, the predictive system 110 may tokenize the string sequence representation (e.g., SMILES representation) of the molecule to produce a tokenized structural formula. Both the constituent units 310 and the interactions may be tokenized. The tokenization may be a machine-learning process. For example, the tokens may take the form of feature vectors that include parameters of an atom or may also be embedding vectors that are generated in a latent space of a neural network. In some embodiments, each token is an embedding that is generated in a latent space of a neural network.

In some embodiments, the predictive system 110 tokenizes 364, for each constituent unit 310 in the physical system 300, coordinates for the constituent unit 310 within a particular physical structure to produce a series of tokens that represent the encoding of the physical structure of the physical system 300. For example, the predictive system 110 may tokenize, for each atom in the molecule, coordinates for the atom within the physical structure to produce tokenized coordinates for the atom.

In tokenizing 364 the coordinates for the constituent units 310, the predictive system 110 may pixelate a rendered sphere to produce a set of pixels. A pixel in at least a subset of the pixels may correspond to a location on the surface of the rendered sphere. For example, the inset 330 in FIG. 3A graphically illustrates a rendered sphere. In turn, the predictive system 110 may tokenize, for the first atom in the molecule, coordinates at the center of the sphere. The predictive system 110 may tokenize, for each additional atom in the one or more molecules, coordinates corresponding to a pixel selected from the set of pixels based on the location of the additional atom relative to the center of a coordinate sphere. For example, the reference atom may be the first atom that defines a reference origin in the spherical hierarchical coordinate system. As such, the coordinates for an atom include coordinates relative to another atom in the one or more molecules. In some embodiments, the coordinates also correspond to a distance between two atoms, such as an additional atom and a reference atom in the one or more molecules. While atoms are used as primary examples of constituent units 310 in these disclosures, the same type of encoding procedure may apply to other types of constituent units 310.

In some embodiments, encoding a physical structure may include using a roto-translational transformation to encode spatial data of one or more atoms. For example, tokenization of constituent units 310 may also be based on a learned roto-translation matrix that combines both rotation and translation in a transformation. The coordinates of the constituent units 310 are transformed to respective translational and rotational values that may be stored in vectors.

In some embodiments, the predictive system 110 combines 366 the tokenized structural formula, and the tokenized coordinates for each constituent unit 310, such as each atom, to produce a tokenized physical structure corresponding to one of the physical structures of a physical system 300. In some embodiments, the physical structure corresponds to a conformer of a molecule or one or more molecules. Since one or more molecules in equilibrium may include multiple conformers, the predictive system 110 may repeat the process 350 to generate additional tokenized physical structures. Each tokenized physical structure may take the form of a sequence of tokens, which may take the form of embeddings that are generated in latent spaces of a neural network. Since different physical structures correspond to different coordinates in describing the constituent units 310, the tokens are encoded differently for each physical structure. As such, for a given physical system 300, oftentimes there are more than one tokenized physical structure. Hence, a physical system 300 can be represented by more than one sequence of tokens.

In some embodiments, the process 350 may be performed by one or more different machine-learned models. For example, in some embodiments, the predictive system 110 may operate an encoding machine-learned model and a predictive representation machine-learned model. The encoding machine-learned model may be used to perform 350 to tokenize different physical structures of a physical system 300. The predictive representation machine-learned model may be used to perform a predictive representation of the physical structures of the physical system 300 based on those encoded tokens. In some embodiments, the encoding and predictive representation may be performed by a single machine-learned model. For example, the encoding may be performed by the predictive representation model as part of the process to predict one or more physical structures of a physical system 300.

In some embodiments, the sequence of tokens in a tokenized physical structure may or may not follow the order of the sequence string representing the original physical system 300. For example, in a SMILES representation, a molecule may be described in a canonical order. Through the training process of a machine-learned model, the tokenized physical structure may follow the order of the SMILES representation or may be completely different from the SMILES representation.

Predicting Next Token

Figure 4A:
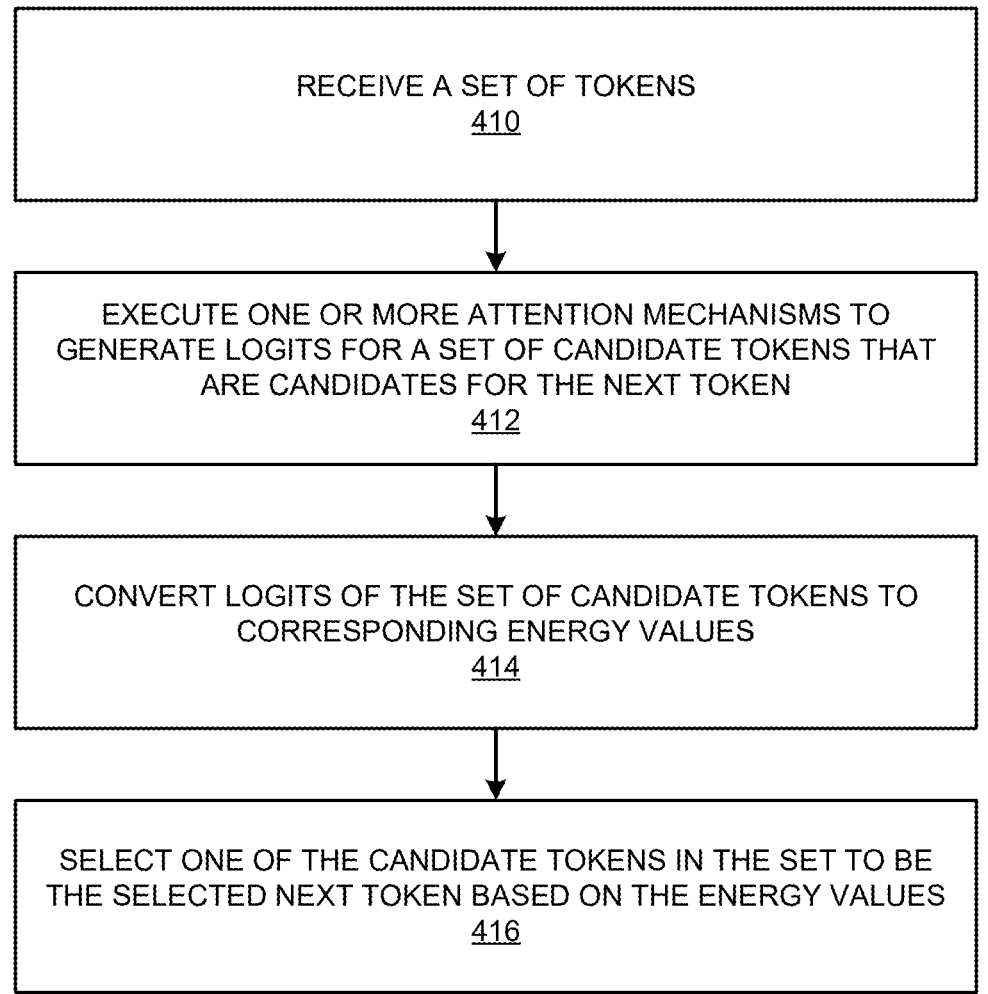
FIG. 4A is a flowchart depicting an example process for predicting the next token given a sequence of tokens representing a portion of a physical structure of a physical system, in accordance with some embodiments.
Figure 4B:
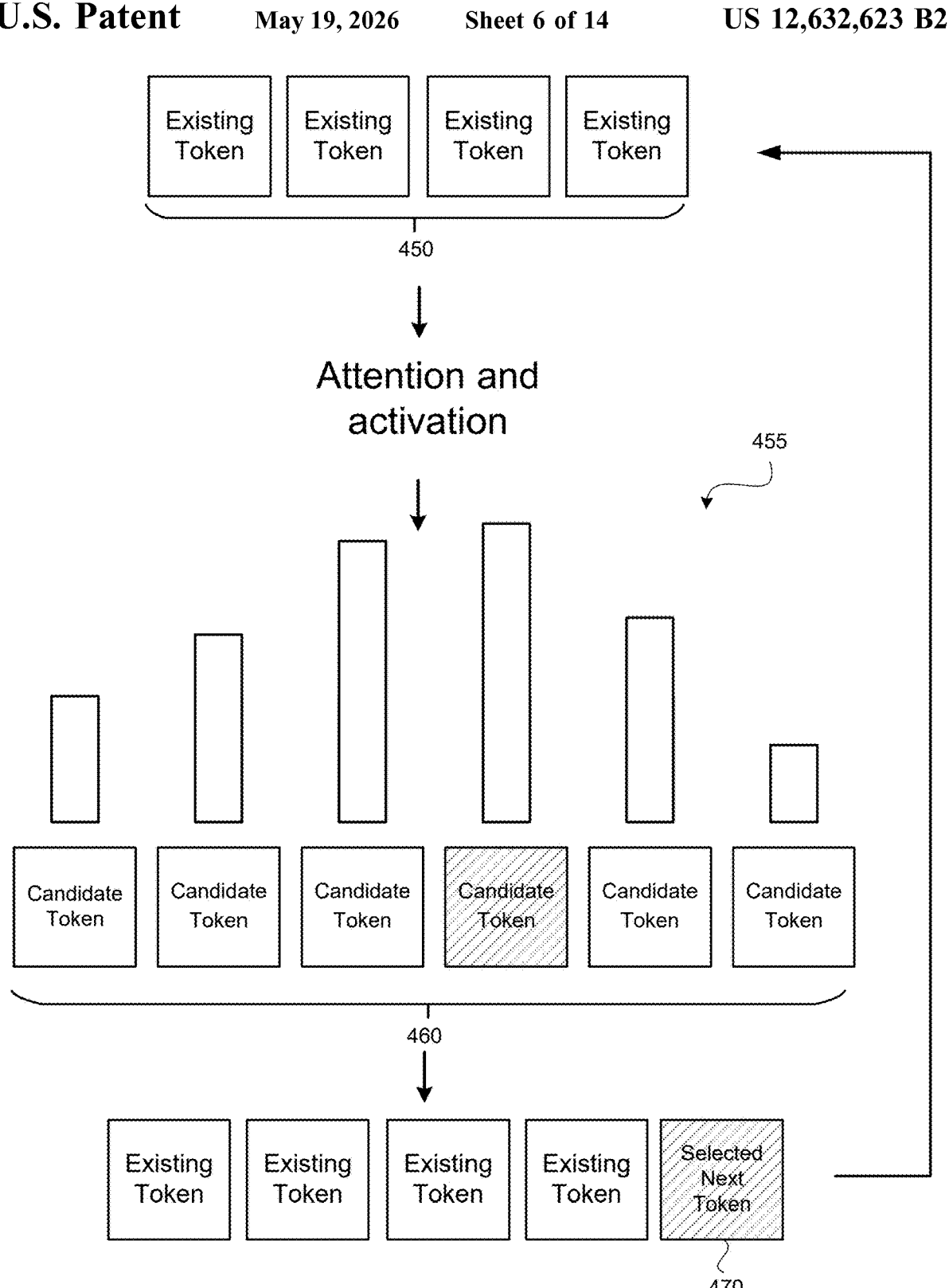
FIG. 4B is a conceptual diagram graphically illustrating the token prediction process, in accordance with some embodiments.

FIG. 4A is a flowchart depicting an example process 400 for predicting the next token given a sequence of tokens representing a portion of a physical structure of a physical system 300, in accordance with some embodiments. The prediction of the next token may be part of the process of simulating the physical structure of a physical system. In various embodiments, the process 400 may include additional, fewer, or different steps than those described in conjunction with FIG. 4A. In some embodiments, the steps of the process 400 may be performed in different orders than the order described in conjunction with FIG. 4A. The process 400 may be carried out by the predictive system 110 or a machine-learned model. For simplicity, the process 400 is described as the predictive system 110 performing certain steps, even though some steps may be performed by other components such as by the predictive system 110 causing a machine-learned model to perform the steps. FIG. 4B is a conceptual diagram graphically illustrating the token prediction process 400, in accordance with some embodiments. FIG. 4A and FIG. 4B are discussed in conjunction with each other.

The process 400 includes a machine-learned model predicting the next token given an existing sequence of tokens. In some embodiments, the token prediction process may be performed in an auto-regressive manner. The process 400 may be performed in the forward propagation of a machine-learned model in training and in inference. Given an initial input, the process 400 may be repeated for multiple iterations to generate a final sequence of tokens that represent a predicted physical structure of a physical system 300. Since the tokens encode coordinate information, angle, and other physical parameters of the constituent units 310, a predicted sequence of tokens can represent the physical coordinates of constituent units 310 in a physical structure. As such, the physical structure can be simulated.

In some embodiments, the predictive system 110 receives 410 a set of tokens. By way of example, the predictive system 110 may receive an initial set of tokens. The initial set of tokens may be part of an input by a user. During inference, the input may be a prompt that may include one or more of the following: a string representation of the physical system (e.g., a SMILES representation), a separator, a descriptor of the three-dimensional structure, a token representing the start of the tokenized three-dimensional structure, and/or a partial conformation. An illustrative example of an input may take the form of <start><key:SMILES>[H]c1nn(C([H])([H])C(=O)N ([H])[C@@] ([H])(C(=O)N2C([H])([H]) C([H])([H]) N(C(=O)C([H])([H])[H])C([H])(C3([H])C([H])([H]) C3([H])[H])C2([H]) [H])C([H])([H])c2c([H])c([H])c ([H])c(C(F)(F)F)c2 [H])c([H])c1C #N<separator><key:3D>. In some embodiments, the temperature of the predictive representation environment is also specified in the input.

Based on the input, a machine-learned model may generate an initial set of tokens. In some embodiments, at least part of the initial set of tokens may correspond to the sequence string representation of a physical system 300, such as a formula of a molecule. The formula of the molecule may be tokenized using step 362 in process 350. In some embodiments, the input of a user may include other elements in addition to or in place of the sequence string. For example, the user may input a prompt that sets the criteria of simulation, the name of a molecule, or a set of conditions that are used for the simulation. The user input may be converted into a set of tokens for a machine-learned model to continue to predict additional tokens in the sequence. For example, the machine-learned model may iteratively perform the process 400 to generate each token. In FIG. 4B, the top of the figure illustrates a sequence 450 of existing tokens. The sequence 450 may correspond to the initial set of tokens or any sequence of tokens as the machine-learned model continues to select additional tokens to be linked to the sequence in an auto-regressive manner.

The existing tokens may represent any constituent units 310 or interactions between constituent units 310, as illustrated in FIG. 3A and FIG. 3B. The tokens encode information such as coordinates, angles, energy, forces, and other suitable data, such as one or more features from sequence data 252, spatial data 254, physical and chemical parameters 256, thermodynamics data 258, and force data 262 discussed in conjunction with FIG. 2.

In some embodiments, the tokens illustrated in FIGS. 4A and 4B correspond to tokens used in the attention mechanism in an autoregressive process that iteratively generates the next token. In an autoregressive model $p(x_i|c_i)$ that infers the next token $x_i \in \Sigma$ from a context $c_i=(x_i-1, x_i-2, \ldots x_i-n$ context), the existing context $c_i$ is represented as the sequence 450 and the next token is represented as the next token 470 in FIG. 4B. For simplicity, the context is defined by the $n_{context}$ previous tokens. In application to a physical system such as molecular data, any token from a vocabulary $\Sigma$, which encodes small molecule chemistry and geometry, may be used as selectable candidates for the next token. In some embodiments, this vocabulary contains sequence characters (e.g., SMILES characters)$(\Sigma_S)$, atom identities $(\Sigma_A)$, tokenized 3D coordinates $(\Sigma_{3D})$, and control tokens to separate entries $(\Sigma_C)$. In some embodiments, the volume elements described by this vocabulary may be mutually disjoint.

The machine-learned model includes tokens that correspond to sequences of key-value pairs for each constituent unit 310 (e.g., an atom), separated by a control character before switching to the next constituent unit 310. In some embodiments, the machine-learned model stores a key-value pair with a value denoting a sequence string (e.g., a SMILES string) and another key-value pair with a value denoting a point cloud representing the sequence of atoms in the sequence string. Each element in the point cloud includes its constituent unit type (e.g., atom type) and 3D coordinates. The order of sequence strings or point clouds is randomly sampled. During inference, the machine-learned model acts as a conformation sampler by conditionally generating the 3D information for the entire physical system's point cloud (e.g., entire molecule's point cloud), given the fixed input key-value pair corresponding to the sequence string (e.g., SMILES) and the key that requests the molecule point cloud. Because each atom type and coordinate in the point cloud is encoded with a fixed number of tokens, the desired length of the conditional generation given an input sequence string is known in advance.

The predictive system 110, using the machine-learned model, executes 412 one or more attention mechanisms to generate logits for a set 460 of candidate tokens that are candidates for the next token. The attention mechanisms are machine-learning processes that are executed in certain layers of the machine-learned model. The attention mechanisms may include self-attention and cross-attention. In some embodiments, existing tokens in the sequencing representing constituent units 310 and interactions are transformed into query, key, and value vectors through projections, such as linear projections. Logits are computed by calculating the dot product between query vectors and key vectors to generate a matrix of coefficients to multiply by value vectors, which are then projected through a liner layer which produces a logit for each token in the vocabulary. The matrix of logits may model a list of candidate tokens potential interactions with the existing tokens, which represent the existing constituent units 310 and interactions. In some embodiments, cross attention may also be used. The machine-learned model may divide the existing sequence into multiple sub-parts, which may roughly correspond to different domains in a physical system 300 (e.g., different parts of a molecule). Cross attention may be performed in a parallel manner to determine the interactions and influence of various parts of the physical system 300 toward the token candidates for the next token.

In some embodiments, it is surprisingly found that the attention mechanism used in a machine-learned language model works well with modeling interactions and coordinates of a three-dimensional physical system 300. In some embodiments, the attention mechanisms in computing logits in the machine-learned model used by the predictive system 110 are unchanged compared to a pre-trained machine-learned language model. In some embodiments, the tokens in the machine-learned model used by the predictive system 110 are encoded differently than language tokens to include information such as spatial data 254, physical and chemical parameters 256, thermodynamics data 258, and force data 262 to allow the machine-learned model to account for interactions and influences of various existing tokens in selecting the next token.

In some embodiments, the predictive system 110, using the machine-learned model, converts 414 logits of the set 460 of candidate tokens to corresponding energy values. The energy values in this disclosure may correspond to the relative energy values. In some embodiments, the logits are interpreted as energy values without conversion. The predictive system 110 may apply a suitable function, such as a non-linear function, to convert the logits to the energy values 455. Depending on the type of energy values 455, different functions that model the energy values may be used. For example, in some embodiments, a physical system 300 is a molecule or one or more molecules and the energy values 455 is chosen to be modeled as a Boltzmann distribution. The predictive system 110 may apply a softmax function to generate the energy values 455 of a set of candidate tokens. Since the energy value also corresponds to the stability of a physical system 300, the energy values may also correspond to the probability distribution of the set 460 of candidate tokens to be selected as the next token. In some embodiments, the relative energies associated with each of the plurality of neighboring positions for the atom are determined using a softmax output of the machine-learned transformer model. In some embodiments, the softmax output generates a ranking in the form of a distribution with different likelihood values, as illustrated in FIG. 4B. In some embodiments, the ranking corresponds to the energy different among the set of candidate physical structures for the physical system 300.

By way of example, the distribution over a set 460 of discrete tokens may be converted into a 3D Boltzmann distribution. To this end, every token is uniquely identified with a volume element $V(x)=\{r \in R^{3n}: tokenize(r)=x\}$. In other words, the volume element $V(x)$ is a set of tokenized coordinates. The symbol r represents the constituent unit coordinates (atom coordinates) and the symbol x represents the tokenized version of the constituent unit coordinates. The predictive system 110 can express the probability of a molecular configuration $r \in R^{3n}$ as the probability of tokens in the token sequence normalized by the total volume element. The predictive system 110 can sample from $p_r$ by sampling $x \sim p$ and then picking each atomic coordinate $r_i \in V(x_i)$ randomly according to a uniform distribution within the volume element. In turn, the probability function may be mapped to an energy function. For example, the negative log-likelihood of the probability distribution implies a dimensionless potential energy function $u(r)=-\ln pr(r)$. Computing the derivatives $\nabla_\theta u$ with respect to the network parameters $\theta$ can be done efficiently in a single backprop through the sequence.

In some embodiments, the predictive system 110, using the machine-learned model, selects 416 one of the candidate tokens in the set 460 to be the selected next token 470 based on the energy value, such as the relative energy value. The selection may be based on the probability scores associated with the candidate tokens. For example, the relative energy values corresponds to a probability distribution. Each candidate token is associated with a probability score that is generated in the activation operation, such as the software operation. In turn, the predictive system 110 may select the candidate token that is associated with the highest probability score, as illustrated in FIG. 4B. In some embodiments, after the next token is selected, the predictive system 110 repeats the process 400 with a new sequence of tokens that includes the newly selected next token 470 to generate a new set of candidate tokens and select the subsequent token. In some embodiments, the selection of tokens and generation of token sequences are determined based on a set of one or more physical conditions, such as a temperature value. In some embodiments, predicting the next tokens may define efficient Monte-Carlo moves in a Boltzmann generator.

In some embodiments, the predictive system 110 may enforce output restriction for the next token selection so that the next token 470 is selected to be valid token entries for a given sequence string (e.g., SMILES) using rejection sampling. With these restrictions, based on the sequence string and the position of the next token, the predictive system 110 can force certain probabilities to 1 and set other token candidate probabilities to 0. For example, at a certain token position, the constituent unit identity (atom identity) probabilities may be set to 1 so that only the constituent unit identity token is selected as the next token 470. In turn, in selecting another next token after the constituent unit identity token, the predictive system 110 may consider only the probabilities corresponding to tokens representing 3D coordinates. The predictive system 110 may restrict the probabilities p to the geometrical subset of the language models vocabulary so that $p(\Sigma_S)=p(\Sigma_A)=p(\Sigma_C)=0$ and $p(\Sigma_{3D})=1$. This way the tokens may be generated in the right order based on the sequence string.

In some embodiments, in determining a set 460 of candidate tokens and selecting the next token 470, the predictive system 110 may execute a depth-first or a breadth-first approach. In some embodiments, each constituent unit 310 is represented by a set of multiple tokens. Each token in the set may represent one of the possible coordinates of the constituent unit 310. The tokens in the set may be arranged by decreasing significance, such as the first token being encoded for the most significant coordinates, the second token being encoded for the second most significant coordinates, etc. In a depth-first approach, the predictive system 110 may generate a set of tokens for a first constituent unit 310 before other sets of tokens are generated. As such, the predictive system 110 generates the tokens for the first constituent unit 310, generates the tokens for the second constituent unit 310 based on the tokens of the first constituent unit 310, and generates the tokens for the third constituent unit 310 based on tokens of the first and second constituent units 310. In a breadth-first approach, in generating the tokens that represent different N constituent units 310, the predictive system 110 can generate first token for each of N constituent units 310 (e.g., N atoms). Those first tokens respectively represent the most significant position bits for the corresponding constituent units. In the second pass of token generation, the predictive system 110 can generate second tokens for those N constituent units 310, and so forth. The machine-learned model can determine where other constituent units 310 are during the rollout of the tokens. The machine-learned model may construct a fuzzy map of where the N constituent units are located before computing the precise locations for any of the constituent units 310.

By way of a specific example, each constituent unit 310 of N constituent units 310 may be encoded using M tokens (e.g., 14 tokens). Hence, if N is equal to 100, there are in total of 1400 tokens. In some embodiments, the token generation may be performed as a depth-first approach or a breadth-first approach. In the depth-first approach, the machine-learned model may generate 14 tokens for a particular constituent unit 310 before moving on to another constituent unit 310. In a breadth-first approach, a single token for each constituent unit 310 may be generated for the 100 constituent units 310. Hence, 100 tokens are generated. Then the machine-learned model generates the second set of 100 tokens, and so forth. In some embodiments, each token in the first set of 100 tokens may represent the most significant bits (MSB) of the coordinates of the corresponding constituent unit 310 (e.g., the first level of sphere pixel) and the token in the second set of 100 tokens would be less significant bits of the coordinates.

Example Training Criteria

Figure 5B:
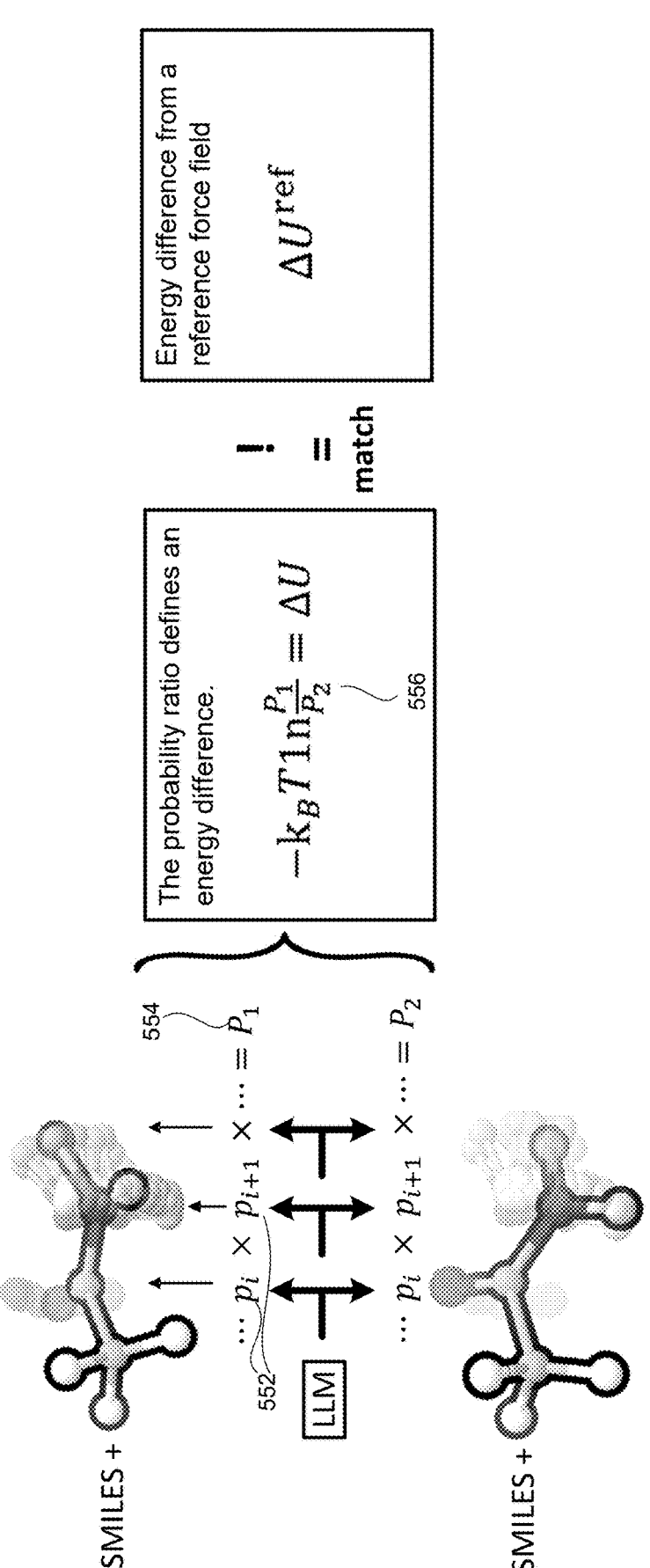
FIG. 5B is a conceptual diagram graphically illustrating an energy-based training objective, in accordance with some embodiments.

FIG. 5A is a flowchart depicting an example process 500 for training a machine-learned model based on one or more training objectives that are related to modeling physical systems, in accordance with some embodiments. In various embodiments, the process 500 may include additional, fewer, or different steps than those described in conjunction with FIG. 5A. In some embodiments, the steps of the process 500 may be performed in different orders than the order described in conjunction with FIG. 5A. The process 500 may be carried out by the predictive system 110 or a machine-learned model. For simplicity, the process 500 is described as the predictive system 110 performing certain steps, even though some steps may be performed by other components such as by the predictive system 110 causing a machine-learned model to perform the steps. FIG. 5B is a conceptual diagram graphically illustrating an energy-based training objective, in accordance with some embodiments. FIG. 5A and FIG. 5B are discussed in conjunction with each other.

In some embodiments, for a given physical system 300, the predictive system 110 generates 510 a set of token sequences representing two or more physical structures corresponding to possible states of the physical system 300. For example, the predictive system 110 may use the process 400 to generate the token sequences that represent different physical structures. In training a machine-learned model, the physical system 300 may be a known physical system that is part of a training set that has data, such as the sequence data 252, the spatial data 254, the physical and chemical parameters 256, the thermodynamics data 258, and the force data 262 stored in the data store 120. The token sequences that represent certain physical structures may correspond to known physical structures of the physical system 300. In some embodiments, the token sequences generated by the machine-learned model in training may not be a complete sequence and may correspond to a partial structure. In some embodiments, the token sequences generated by the machine-learned model in training may correspond to complete sequences.

The predictive system 110 stores 512 activation outputs corresponding to the tokens in the token sequences. For example, referring to FIG. 5B, for a given token sequence, each token may be associated with an activation output 552 that is generated when the token is being selected. An activation output may take the form of a softmax output, for example in embodiments where a molecule's distribution of physical structures is modeled by an energy function, as in a Boltzmann distribution. Each activation output may correspond to the probability of the token. For another token sequence, the sequence may have a different set of activation outputs. The predictive system 110 may record different sets of activation outputs corresponding to different physical structures.

In some embodiments, the predictive system 110 determines 514 an aggregated energy state 554 for each token sequence for the plurality of tokens or token sequences that represent the physical structures. The aggregated energy state 554 may be determined by aggregating the activation outputs of individual tokens in the sequence. The aggregation may be performed by multiplying individual activation outputs. In some embodiments, the activation outputs of tokens that correspond to the constituent units 310 are used to combine the aggregated energy state 554. The aggregated energy state 554 may correspond to a probability value. In some embodiments, the predictive system 110 determines the aggregated energy states 554 for different physical structures of a physical system 300. In some embodiments, the predictive system 110 determines 516 energy difference between two or more physical structures. For example, the predictive system 110 determines the energy difference between two physical structures according to an example formula 556. The constant kg represents the Boltzmann constant and T may correspond to a temperature value for the predictive representation. AU represents the energy required to transform the system from the first physical structure to the second physical structure. The predictive system 110 may also construct a distribution based on the aggregated energy states 554 of two or more physical structures. The difference among multiple physical structures is not required to be the direct difference between two values but can also be a comparison between various energy profiles and statistical values. For example, the difference between more than two physical structures may be defined based on a probability distribution, variance of energy states, or another statistical measure. By determining the energy differences among the physical structures, a distribution such as the Boltzmann distribution of the physical system 300 may be constructed based on token prediction by the machine-learned model.

In some embodiments, the predictive system 110 compares 518 the relative energy values of token sequences that represent simulated physical structures to the ground truth. The ground truth may correspond to the laboratory data of the physical system 300, such as the energy different data determined from a reference force field. In other words, in some embodiments, in training a machine-learned model, the predictive system 110 uses the machine-learned model to predict a simulated energy value based on predicted token sequences. In turn, the predictive system 110 compares the simulated energy value to the ground truth energy value. In some embodiments, the predictive system 110 may use a suitable loss function, such as an energy-based loss function or a force-based loss function, to define the training objective of the machine-learned model. In some embodiments, the loss function of the machine-learned model may be defined based on formula 556. In some embodiments, the training objective of the machine-learned model is to generate physical structures whose corresponding Boltzmann distribution adheres to the Boltzmann distribution in the ground truth data.

The technique of matching the Boltzmann distribution in predictive representation to the ground truth Boltzmann distribution may be referred to as energy-based training. In some embodiments, the machine-learned model can be trained by directly matching the Boltzmann distribution implied by a given target energy function. To this end, the predictive system 110 may augment the loss function by a reverse Kullback-Leibler term $D_{KL}(pr\|\mu)=E_{r}\sim p_{r}[v(r)-u(r)]$.

In some situations, this term may lead to model collapse and training instability. In some embodiments, a more efficient alternative loss function for energy-based training uses the sample variance instead: $D_{VarGrad}(p_{r},\mu)=Var_{r\sim q}[v(r)-u(r)]$. In these embodiments, the variance is computed over a batch of samples from some distribution q. By using this loss function, the energy may be matched up to a constant. Under weak conditions on the distribution q, this loss is asymptotically unbiased. In some embodiments, in computing the loss, the predictive system 110 may construct a distribution q that includes a mixture of samples generated by the machine-learned model and samples from a target distribution. In some embodiments, the predictive system 110 may construct a distribution q as a mixture distribution over local minima of a quantum mechanical potential energy function, conformations generated by molecular predictive representations, samples generated by the model, samples generated by previous checkpoints, and a replay buffer. In other words, the comparison step 518 may be carried out with a mixture of samples, some generated by the model and others retrieved from other sources.

In some embodiments, regularization techniques may be used, for example introducing noise to some of those samples.

In some embodiments, the trained machine-learned model is a language model that combines with a Boltzmann generator. In some embodiments, the machine-learned model has the ability to compute normalized likelihoods of any given molecular conformation and utilize these likelihoods for energy-based training and importance sampling. Together, the predictive system 110 provides an approach to sample three-dimensional molecular conformations from a given target energy function and remove any sampling bias through reweighting. In some embodiments, the normalized likelihoods in the language model are the softmax outputs for both physical structures and text tokens.

In some embodiments, the machine-learned model discretizes the probabilistic models in Boltzmann generators so that a language model framework can be used. Boltzmann generators are typically constructed using continuous probabilistic models (normalizing flows), and language models operate on discretized representations across a vocabulary of tokens. In some embodiments, in combining a machine-learned language model with a Boltzmann generator framework, the predictive system 110 uses the language model-generated conformations together with the model likelihoods to reweight to a given target energy function. As such, the machine-learned language models provide normalized likelihoods in the softmax outputs. The normalized likelihoods can be used in a Boltzmann generator framework. An energy function may be used to reweight the machine-learned model's samples to a given target Boltzmann density $u\propto e^{-\beta v}$ with importance weights w(r)=softmax (u(r)-v(r)).)). In some embodiments, other types of energy function may be used, such as a quantum mechanical energy calculation. Various types of energy function may include force field, quantum mechanics, density functional theory (DFT) energies and forces, a s well as molecular mechanics, ab initio calculations, semi-empirical methods, empirical potential functions, electrostatic potential, and potential energy surfaces.

In some embodiments, instead of or in addition to comparing the relative energy values between the predictive representation and the ground truth, the predictive system 110 may also compare the force data in the predictive representation to the ground truth. By way of example, using only the relative energy in training may have two drawbacks in some situations. First, energy training provides a merely one-dimensional signal to guide the backpropagation process, which becomes inefficient for high-dimensional structures. Second, macromolecules such as proteins or nucleic acids are usually simulated in explicit solvent, so that the relative energy of the full system (including waters and ions) does not correspond to the system generated by the language model (only the proteins). In some embodiments, this situation can be improved by using force data in training.

Instead of using the overall energy states of physical structures, the force data may be vectors (with magnitudes and spatial directions), each of which may correspond to a constituent unit 310. In some embodiments, the predictive system 110 distills the language model's likelihoods (softmax outputs) into a differentiable force field. For example, in some embodiments, for a given token sequence, the aggregated energy state 554 may be determined relative to the system. The aggregated energy state 554 is a scalar. Tokens in the token sequence may also be associated with spatial coordinates. Along with the selected token, other candidate tokens are also associated with activation outputs and spatial coordinates in the proximity of the selected token. The predictive system 110 may determine the gradients of the energy based on activation outputs over a set of spatial coordinates. The gradients may correspond to the force field values of a physical structure. For example, a force associated with an atom in the one or more molecules may be determined based on, for one or more of the plurality of neighboring positions for the atom, the relative energy associated with neighboring positions and a distance between the atom position and the neighboring positions that correspond to different tokens. In some embodiments, the force associated with each atom in the model is based on a collective gradient of relative energy associated with the plurality of neighboring positions for the atom. In some embodiments, the determined force associated with an atom as generated by the machine-learned model is based additionally or alternatively on the force applied from a solvent or solution on the atom in the one or more molecules. In some embodiments, the force associated with an atom as generated by the machine-learned model is additionally or alternatively based on inherent forces in a physical system 300 comprising the one or more molecules. The predictive system 110 may compare those force field values to the force field values in the ground truth. A loss function may be defined based on the differences among the force field values.

By way of further example, in using force field data, the predictive system 110 may use the likelihoods obtained from a single forward pass to compute forces more efficiently. A forward pass yields likelihoods $p(x_1, \ldots, x_{i-1}, x_i = x)$ for all tokens $x \in \Sigma_{3D}$ and all indices $i = 1, \ldots, n_{tokens}$.

The likelihood information for the final token, $x_{ntokens}$, is first discussed. Here, each $x \in \Sigma_{3D}$ corresponds to a different position of the final atom. From these discrete likelihoods, the predictive system 110 may have the value of the potential energy at numerous spatial locations, which allows the machine-learned model to approximate directional derivatives, e.g. through finite differences.

The same kind of numerical differentiation can also be applied to all previous tokens in the sequence. However, while the finite differences of the final token approximate derivatives of a potential energy for the whole structure, previous finite differences approximate a different energy function. This other energy corresponds to the marginal distribution over the first i degrees of freedom, where the remaining degrees of freedom $(x_{i+1}, \ldots, x_{ntokens})$ are integrated out. In the context of coarse graining, this may be referred to as the potential of mean force (PMF). The predictive system 110 may define the PMF over partial sequences. The finite differences among the PMF yield approximations to the gradient of the energy, which corresponds to the force value.

In some embodiments, the PMF can be written as the mean force over fine-grained forces. Each force component may take the form of a projection of the forces onto the j-th coordinate. In some embodiments, Euclidean projection may be chosen. The expectation is over the Boltzmann ensemble of the fine-grained subspace. Potentials of mean force can be obtained by force matching, such as by minimizing the force residual between a coarse-grained ansatz and the fine-grained forces. Given Boltzmann distributed coordinates from a reference potential v and corresponding forces $f = -\nabla v(r)$, the predictive system 110 can force-match the finite difference approximations across the whole sequence by minimizing a force loss function.

Force data may be more advantageous to be used in training compared to other data. In a physical system 300, the forces relative to the environment, such as the solvent, typically asymptotically approach an unbiased level if the reference conformation is sampled from the equilibrium Boltzmann distribution. As such, using force data in training may provide a more accurate predictive representation because the influence of the surrounding environment such as the solvent may represented in the force data.

In some embodiments, the predictive system 110 determines 520 backpropagated gradients based on comparing the energy and/or force values to the ground truth. In turn, the predictive system 110 backpropagates the gradient values to the weights of the machine-learned model to update the weight values. After the weight values are updated, the predictive system 110 may execute another iteration (e.g., another epoch) of training. The predictive system 110 uses the machine-learned model, in forward propagation, to predict different token sequences that represent physical structures of physical systems in the training set. The predictive system 110 compares the simulated energy and/or force values to the ground truth and updates the weight values again in another iteration.

By using a language model fine-tuned to be a Boltzmann generator, the predictive system 110 enables a scalable solution to Boltzmann generators for real-world applications. In contrast to conventional flow-based architectures, language models have been shown to be highly scalable. Additionally, language models are often multi-modals and are transferable across data modalities, which enables the construction of powerful models that can jointly model ligand chemistry and geometry. Due to the versatility of the machine-learned models in this disclosure, the models have numerous applications in drug discovery, from conformational sampling to identifying synthetically accessible binders with favorable pharmacological properties.

Example Model Structure

Figure 6:
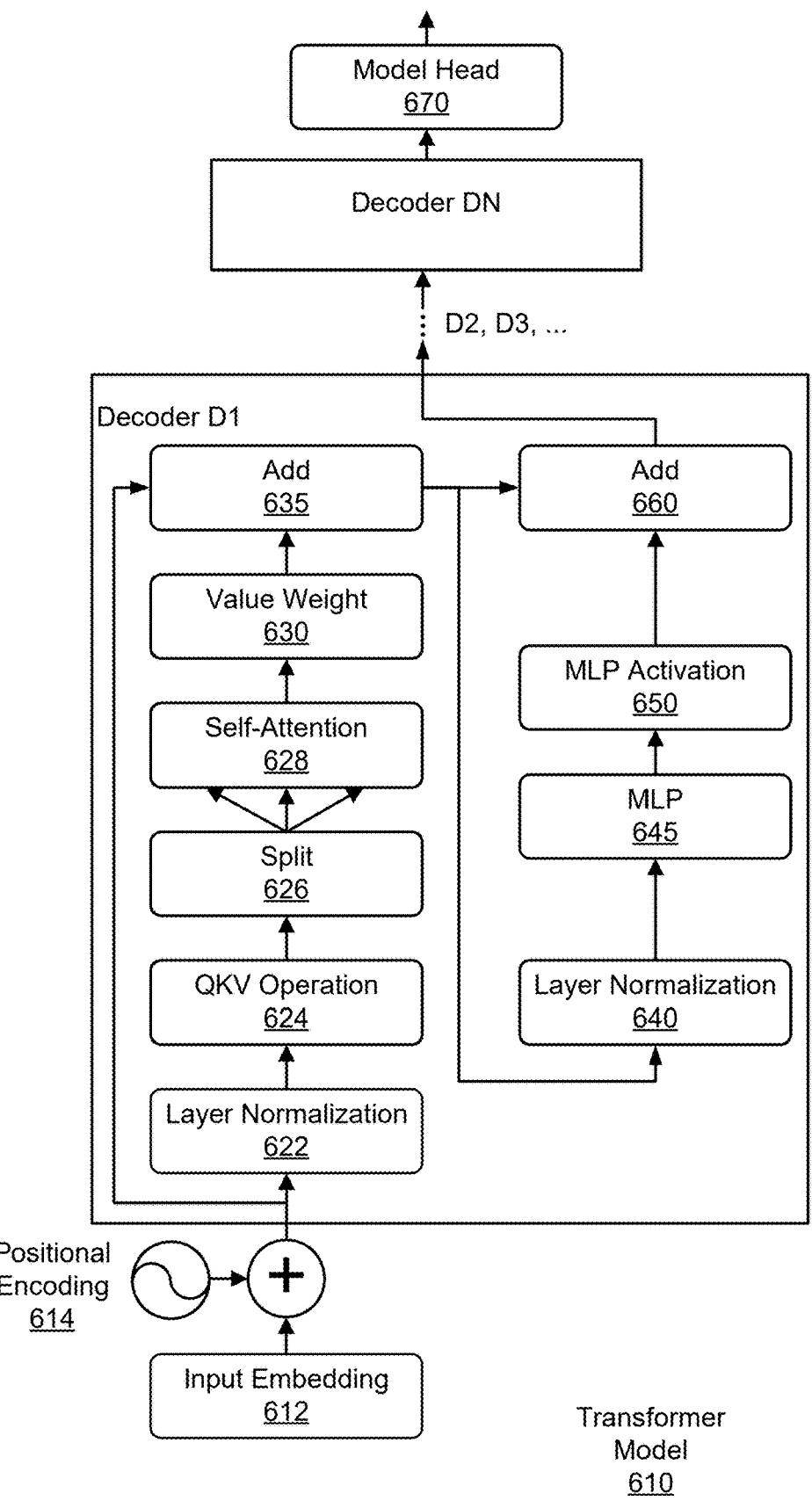
FIG. 6 is a conceptual diagram of functional blocks of a transformer-based neural network model, in accordance with some embodiments.

FIG. 6 is a conceptual diagram of functional blocks of a transformer-based neural network model 610, in accordance with some embodiments. For simplicity, the transformer-based neural network model 610 is referred to as a transformer model 610. The transformer model 610 is an example of a machine-learned model that is discussed in conjunction with FIG. 1 through FIG. 5B for predictive representations of various physical systems 300. An actual transformer model 610 may be a large language model that involves numerous neurons, such as a large number of decoders, and a large number of parameters. The structure illustrated in FIG. 6 is part of a decoder for generating token attention. In a language processing task, the input may take the form of a sequence of words (e.g., a prompt) that may be encoded to a sequence of input tokens. For a predictive representation task with respect to a physical system 300, the input may take the form of a string sequence or any suitable input as discussed in step 410 in conjunction with FIG. 4A. Each token may represent a respective embedding in a latent space. Based on the input tokens, the transformer model 610 may repeatedly generate a sequence of output tokens in an autoregressive manner.

In some embodiments, a transformer model 610 includes input embedding layers 612 for generating embedding tokens. The generation of embeddings may be performed as part of the training of the models. The input embedding layers 612 may encode various constituent units 310 of a physical system 300 based on one or more encoding techniques discussed in FIG. 3A and FIG. 3B. The transformer model 610 also includes a positional encoder 614 that inject position information to the tokens. For example, the string representation (e.g., SMILES) of a physical system signifies the position information of various constituent units 310 in the physical system 300. When the constituent units 310 and the interactions between the constituent units 310 are encoded as tokens, the positions of those tokens, as indicated by the structural expression such as a structural formula that is represented by the string representation, are encoded with the tokens. The positional encoder 614 may use alternating sine function and cosine function to add position data to the embedding tokens. Alternatively, or additionally, the position encoder 614 may also use technique such as rotary position embedding (RoPE) for positional encoding. The positional encoding data are added to the token embeddings to rotate the token embeddings at different degrees to signify positions.

In some embodiments, a transformer model 610 includes a set of N decoders, D1, D2, . . . , and DN. A decoder receives a set of input representations and generates a set of output representations. For example, the first decoder D1 generates a set of output representations. Each subsequent decoder may receive the set of output representations of a previous decoder and generate another set of output representations. For example, the second decoder D2 placed after the first decoder D1 may receive the set of output representations generated by the first decoder D1, and generate another set of output representations. This process is repeated until the set of output representations for the final decoder is generated. The representations in each decoder may be latent representations that may or may not correspond to any real-world concepts. In some embodiments, some of the decoders may correspond to analyzing data dimensions that correspond to various types of data that are used to model a physical system 300, such as the sequence data 252, the spatial data 254, the physical and chemical parameters 256, the thermodynamics data 258 and the force data 262.

The transformer model 610 may include a model head block 670 that receives the set of output representations from the final decoder DN and generates an output token as the output for the current iteration.

As shown in FIG. 6, a decoder in the transformer model 610 includes a first layer normalization block 622, a query-key-value (QKV) operation block 624, a split block 626, a self-attention block 628, a value weight block 630, a first add block 635, a second layer normalization block 640, a multi-layer perceptron (MLP) block 645, an MLP activation block 650, and a second add block 660. In some embodiments, the computations in one or more blocks in the decoder are managed by the predictive system 110. While the operations in the first decoder D1 are described as an example, the remaining decoders in the set may include similar operations as the first decoder D1.

FIG. 6 illustrates a flow for attention mechanism of a transformer model 610. The transformer model 610 receives an input sequence, such as a sequence string 340. Each symbol may be converted into a token that takes the form of an embedding vector. The sequence of symbols may be represented as a matrix of embedding vectors with each embedding vector being arranged in a row of the matrix. The layer normalization block 622 receives an input dataset (e.g., the matrix of embedding vectors) and normalizes the data values to generate a normalized dataset (e.g., a normalized matrix).

The QKV operation block 624 receives the normalized input dataset and performs three separate projections to respectively generate a query matrix, a key matrix, and a value matrix. Specifically, the QKV operation may apply a QKV weight matrix, which is a trained set of parameters of the transformer model 610, to the normalized dataset. The operation may include a matrix multiplication between a weight matrix and the normalized input dataset. The QKV operation may model the interactions among constituent units 310 in a physical system 300.

The split block 626 may split the output of the QKV operation block 624 into a query matrix, a key matrix, and a value matrix. The self-attention block 628 receives the query matrix, the key matrix, and the value matrix as the inputs and generates an attention matrix. The generation of an attention matrix includes multiplying the query matrix and a transposed version of the key matrix. In generating attention scores, a softmax operation to each row of the attention matrix may be applied. In some embodiments, the softmax operation converts the logit scores into relative energy values. In some embodiments, the logits can be interpreted as relative energy values without conversion. Conceptually, the attention score may be represented by an equation attention=softmax (Q*K/Scale). The correspondence between logits and relative energy values allows the transformer model 610 to model a physical system 300 that is represented by tokens.

The value weight block 630 receives data related to the attention score and generates an attention dataset. The output for each token is a weighted combination of value vectors with the weights given the attention scores determined in the self-attention block 628. The outputs of the value weight block 630 may be computed by a matrix multiplication between the value matrix and the attention matrix after softmax is applied. The add block 635 concatenates results from various layers. The results of the attention sublayer, including results from add block 635, may be further normalized using the second layer normalization block 640.

A decoder may include one or more multi-layer perceptron (MLP) blocks 645 that include additional neural network layers, which may take the form of feed-forward fully connected layers. One or more MLP blocks 645 may include an MLP activation block 650. In some embodiments, an MLP activation block 650, which typically includes a non-linear activation function, may be nestled between two linear MLP blocks 645. The MLP blocks 645 along with the MLP activation block 650 may be used to introduce non-linearity, perform feature extraction, reduce dimensionality and select tokens for the next decoder. In some embodiments, the activation function used in the MLP activation block 650 may be any suitable activation function such as a sigmoid function, a hyperbolic tangent function (tanh), a rectified linear unit function (ReLU), or a Gaussian Error Linear Unit function (GeLU). Outputs of the MLP blocks may be further concatenated in the add block 660.

The output of the first decoder D1 is passed to a subsequent decoder. This process is repeated until the set of output data from the final decoder DN is generated. While each decoder may involve similar operations as the first decoder D1, the trained set of parameter values that are associated with the operations may be different from decoder to the decoder. The model head block 670 receives output from the final decoder DN to determine an output token. Additional softmax operation may be performed at LM head block 670 to determine the final attention scores.

The LM head block 670 may select the next token 470. The selection of the next token in the transformer model 610 may correspond to the process 400 described in FIG. 4A and FIG. 4B.

Training and Retraining of a Machine-Learned Model

Figure 7:
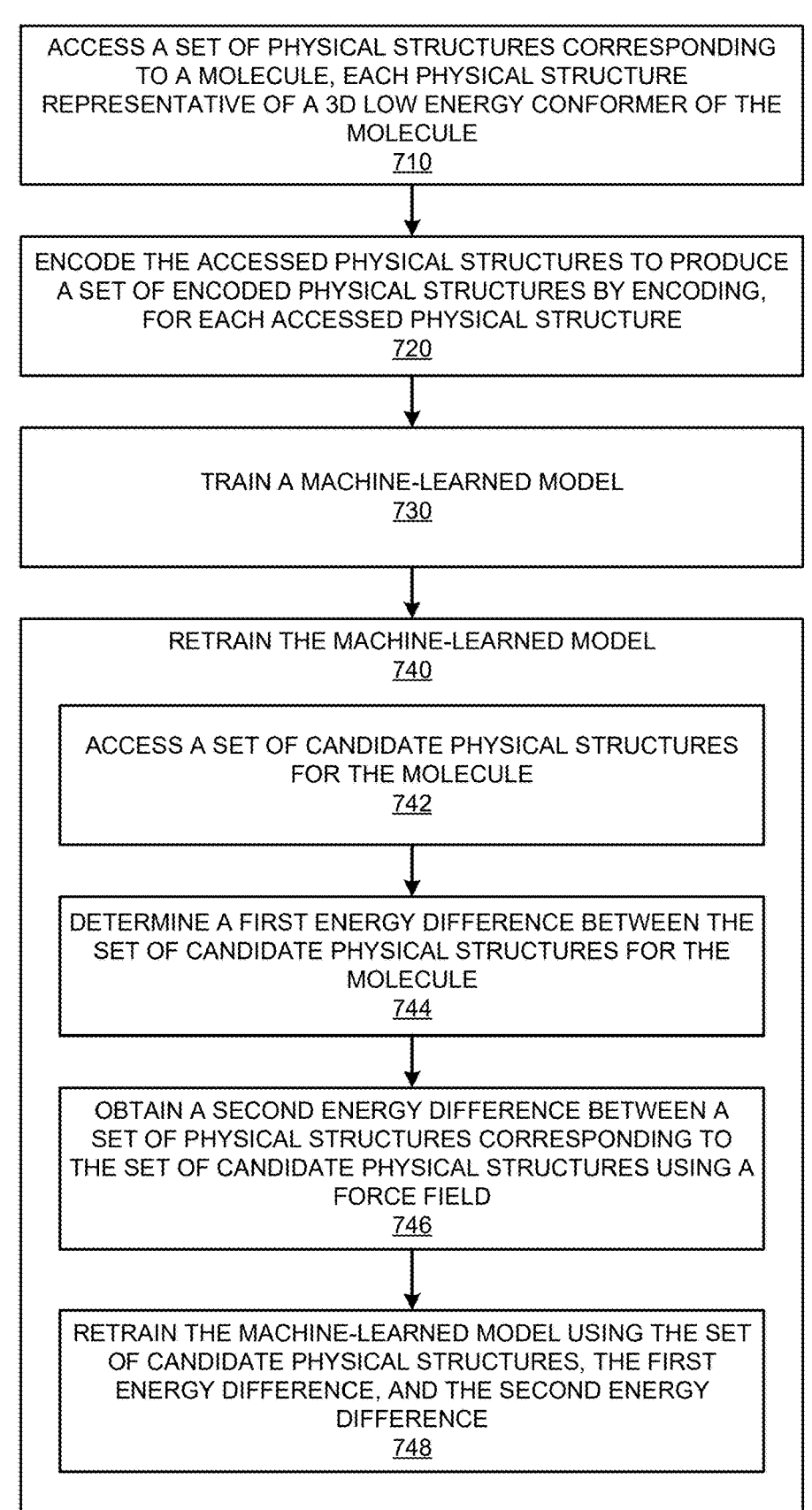
FIG. 7 is a flowchart depicting an example process for training and re-training a machine-learned model, in accordance with some embodiments.

FIG. 7 is a flowchart depicting an example process 700 for training and re-training a machine-learned model, in accordance with some embodiments. In various embodiments, the process 700 may include additional, fewer, or different steps than those described in conjunction with FIG. 7. In some embodiments, the steps of the process 700 may be performed in different orders than the order described in conjunction with FIG. 7. The process 700 may be carried out by the predictive system 110 or a machine-learned model. For simplicity, the process 700 is described as the predictive system 110 performing certain steps, even though some steps may be performed by other components such as by the predictive system 110 causing a machine-learned model to perform the steps.

While the process is described using a molecule as an example of a physical system 300, the process may be used to train and re-train a machine-learned model that is used to sample simulations of other physical systems 300.

In some embodiments, the predictive system 110 accesses 710 a set of physical structures corresponding to a molecule or one or more molecules. Each physical structure is representative of a 3D low-energy conformer of the one or more molecules. The set of physical structures may be accessed from a variety of sources. For example, in some embodiments, some physical structures may be generated by molecular dynamics predictive representations. Other physical structures may be known in the literature and may be stored in an existing database. In some embodiments, the training data may include sets of known physical structures at a particular temperature, such as at a low temperature.

In some embodiments, the predictive system 110 encodes 720 the accessed physical structures to produce a set of encoded physical structures. The encoding process is further discussed in FIG. 3A and FIG. 3B. The encoding process may include encoding, for each accessed physical structure, a position of each atom of the one or more molecules within the accessed physical structure.

In some embodiments, the predictive system 110 trains 730 a machine-learned model using the encoded physical structures. In various embodiments, a wide variety of machine-learning techniques may be used. Examples include different forms of supervised learning, unsupervised learning, and semi-supervised learning such as decision trees, support vector machines (SVMs), regression, Bayesian networks, and genetic algorithms. Deep learning techniques such as neural networks, including convolutional neural networks (CNN), recurrent neural networks (RNN), short-term memory networks (LSTM), and transformer models may also be used. An example architecture of a transformer model is discussed in FIG. 6, but the type of machine-learned model may also be used. The training techniques for a machine-learned model may be supervised or semi-supervised. In supervised learning, the machine-learned models may be trained with a set of training samples that are labeled. For example, for a machine-learned model trained to simulate physical structures, the training samples may be physical systems with known physical systems and associated data that is described in FIG. 2. In some embodiments, the machine-learned model may first be trained to be a language model using textual training samples and subsequently fine-tuned to a predictive representation model. In some embodiments, the machine-learned model is a multi-modal model that is trained with various types of training samples such as text, images, and videos so that the machine-learned model is able to process those types of data in addition to simulating physical structures of a physical system.

In some embodiments, the predictive system 110 retrains 740 the machine-learned model iteratively. Retraining may correspond to different types of operations. For example, in some embodiments, the retraining may correspond to later iterations of an initial training. In some embodiments, the retraining may correspond to further training of a trained model. In some embodiments, the retraining may correspond to the fine-tuning of a pre-trained model. A pre-trained model may be a predictive representation model or may be a language model that is not originally trained for predictive representation purposes. For example, a machine-learned model may be a pre-trained multi-modal model that is trained 730 using text, images, and videos. In retraining the machine-learned model, physical structure data is used to fine-tune the model to be able to simulate physical structures.

In some embodiments, the predictive system 110 accesses 742 a set of candidate physical structures for the one or more molecules. The generation process is further described in FIG. 4A and FIG. 4B. In some embodiments, the machine-learned model is a neural network, which may receive an input and generate an output. The input of the neural network may be a sequence of tokens of a training sample in the training process. The output may take the form of predicted token sequences that represent a physical structure. In some embodiments, the training sample may also include known conformers and other physical structures of physical systems and corresponding data associated with the conformers and other physical structures. In some embodiments, the predictive system 110 may provide a single conformer structure of a physical system in the training data to the machine-learned model. After training and retraining, the machine-learned model is able to predict additional different conformer structures of the physical system. In some embodiments, for a new physical model, no conformer is present in the training data and the machine-learned model is able to predict one or more conformer structures.

The neural network may include different kinds of layers, such as convolutional layers, pooling layers, recurrent layers, fully connected layers, and other types of layers such as decoder layers that are discussed in FIG. 6. A convolutional layer convolves the input of the layer with one or more kernels to generate different types of datasets that are filtered by the kernels to generate feature maps. Each convolution result may be associated with an activation function. A convolutional layer may be followed by a pooling layer that selects the maximum value (max pooling) or average value (average pooling) from the portion of the input covered by the kernel size. The pooling layer reduces the spatial size of the extracted features. In some embodiments, a pair of convolutional layer and pooling layer may be followed by a recurrent layer that includes one or more feedback loops. The feedback may be used to account for spatial relationships of the constituent units 310 in a physical system 300. The layers may be followed by multiple fully connected layers that have nodes connected to each other. The fully connected layers may be used for classification.

In some embodiments, the predictive system 110 determines 744 a first energy difference between the set of candidate physical structures for the one or more molecules. In some embodiments, the softmax output of a machine-learned model generates a ranking in the form of a distribution with different likelihood values, as illustrated in FIG. 4B. In some embodiments, the ranking corresponds to the energy different among the set of candidate physical structures for the physical system 300. In some embodiments, the predictive system 110 obtains 746 a second energy difference between a set of physical structures corresponding to the set of candidate physical structures using a method to calculate absolute or relative reference energy values (energy functions) of systems of atoms and their respective coordinates, such as by using force field or quantum mechanical calculations. The process of training using energy and force data is further discussed in FIG. 5A and FIG. 5B. Various types of energy functions may include force field, quantum mechanics, density functional theory (DFT) energies and forces, as well as molecular mechanics, ab initio calculations, semi-empirical methods, empirical potential functions, electrostatic potential, and potential energy surfaces.

By way of example, a machine-learned model may be associated with one or more objective functions. Each of the objective functions generates a metric value that describes the objective goal of the training process. The training process may be intended to reduce the error rate of the model in generating predictions. In such a case, the objective function may monitor the error rate of the machine-learned model. In some embodiments, an objective function may be called a loss function. Other forms of objective functions may also be used. In some embodiments, in training a predictive representation model, the objective function may correspond to a difference or divergence of the simulated distribution to the ground truth distribution, as discussed in FIG. 5B and FIG. 7. In some embodiments, this difference or divergence is computed by differences in energy values or forces of the simulated distribution with respect to relative energies or force of the ground truth distribution. In various embodiments, the error rate may be measured as cross-entropy loss, L1 loss (e.g., the sum of absolute differences between the predicted values and the actual value), L2 loss (e.g., the sum of squared distances), or common divergences between probability distributions (e.g. Kullback-Leibler divergence, Jensen-Shannon divergence, Wasserstein distance, Fisher information metric). In some embodiments, the loss function may include terms that prevent divergence from a reference model, such as a pre-trained machine-learned model, for example penalty terms, including Kullback-Leibler divergences between the reference model and trained model.

Training and re-training of a machine-learned model may include forward propagation and backpropagation. Each layer in a machine-learned model may include one or more nodes, which may be fully or partially connected to other nodes in adjacent layers. In forward propagation, the machine-learned model performs the computation in the forward direction based on the outputs of a preceding layer. The functions may also include an activation function that adjusts the weight of the output of the node. Nodes in different layers may be associated with different functions. In forward propagation, the predictive system 110 generates token sequences that represent different physical structures. The predictive system 110 determines 744 a first energy difference between the set of candidate physical structures for the system of one or more molecules.

Training and retraining of a machine-learned model may include an iterative process that includes iterations of predicting token sequences, monitoring the performance of the machine-learned model using one or more objective functions, and backpropagation to adjust the weights (e.g., weights, kernel values, coefficients) in various nodes. For example, the predictive system 110 obtains, from the training data, 746 a second energy difference between a set of physical structures corresponding to the set of physical structures using a method to calculate absolute or relative reference energy values of systems of atoms and their respective coordinates, such as by using force field or quantum mechanical calculations. Various types of energy functions may include force field, quantum mechanics, density functional theory (DFT) energies and forces, as well as molecular mechanics, ab initio calculations, semi-empirical methods, empirical potential functions, electrostatic potential, and potential energy surfaces.

The computing device may adjust, in a backpropagation, the weights of the machine-learned model based on the comparison. The computing device backpropagates one or more error terms obtained from one or more loss functions to update a set of parameters of the machine-learned model. The backpropagation may be performed through the machine-learned model and one or more of the error terms based on a difference between a label in the training sample and the generated predicted value by the machine-learned model.

By way of example, each of the functions in the neural network may be associated with different coefficients (e.g., weights and kernel coefficients) that are adjustable during training. In addition, some of the nodes in a neural network may also be associated with an activation function that decides the weight of the output of the node in forward propagation. Common activation functions may include softmax functions, step functions, linear functions, sigmoid functions, hyperbolic tangent functions (tanh), and rectified linear unit functions (ReLU). After an input is provided into the neural network and passes through a neural network in the forward direction, the energy and/or force distributions may be compared to the ground truth data in the training set to determine the neural network's performance. The process of prediction may be repeated for other samples in the training sets to compute the value of the objective function in a particular training round. In turn, the neural network performs backpropagation by using gradient descent such as stochastic gradient descent (SGD) to adjust the coefficients in various functions to improve the value of the objective function.

In some embodiments, the predictive system 110 retrains 748 the machine-learned transformer model using the set of candidate physical structures, the first energy difference, and the second energy difference. Multiple rounds of forward propagation and backpropagation may be performed. Training may be completed when the objective function has become sufficiently stable (e.g., the machine-learned model has converged) or after a predetermined number of rounds for a particular set of training samples. In some embodiment, the retraining criteria are satisfied when an average difference between the first energy difference and the second energy difference for a threshold number of consecutive iterations is less than a threshold difference. In some embodiments, the retraining criteria are satisfied when a distribution of candidate physical structures generated over a threshold number of consecutive iterations is within a threshold difference from a Boltzmann distribution. In some embodiments, the retraining is completed when the model performance on a validation holdout set starts to decrease. The holdout set is not used in training or retraining the machine-learned model.

In some embodiments, the loss function may be defined as $D_{VarGrad}(p_r, \mu)=Var_{r \sim q}[v(r)-u(r)]$ or a similar version of this explicit example. In these embodiments, the variance is computed over a batch of samples from some distribution q. In some embodiments, in computing the loss, the predictive system 110 may construct a distribution q that includes a mixture of samples generated by the machine-learned model and samples from a target distribution.

In some embodiments, a stable energy-based fine-tuning may be used to minimize the loss function, such as the loss function discussed in the above paragraph. In some situations, minimizing the loss function without constraints would produce models that are overspecialized in producing geometric tokens in accordance with the target distribution. To allow for a more meaningful fine-tuning, in some embodiments, the predictive system 110 may modify the optimization procedure as follows.

First, the predictive system 110 may apply certain VarGrad modifications. The predictive system 110 may detach the mean of the energy difference from the back-propagation graph and annihilate gradients for negative samples. These modifications reduce the gradient variance and incentivize mode coverage, which is generally desirable for Boltzmann generators. Second, the predictive system 110 may constrain the model during fine-tuning to retain the bulk of the capabilities that were acquired during pre-training. This can be achieved by introducing a loss term that penalizes the KL divergence from the pre-trained model.

Third, predictive system 110 may also constrain the probabilities of all non-geometric tokens to the pre-trained model. Since the VarGrad loss promotes the exclusive generation of geometric tokens, this additional constraint improves multimodal language models to remember the generation of other modalities. In some embodiments, the predictive system 110 may introduce two additional penalties between the pretrained and fine-tuned model, namely a KL divergence to constrain the probability of generating any geometric token and the relative probabilities over all non-geometric tokens. Other methods to enforce this constraint may also be used, for example, gradient projection.

The trained machine-learned models may provide various applications. For example, after the machine-learned transformer model is retrained, the predictive system 110 may be used to generate a target probability distribution of structures for a target molecule or a portion thereof. The predictive system 110 may be used to generate a probability distribution of structures for a system of two or more molecules. The predictive system 110 may compare the target probability distribution and the probability distribution to predict a binding affinity between the target molecule or a portion thereof and another molecule (e.g., protein and ligand, protein and protein, protein and peptide, ligand and ligand, protein, ligand and protein). In some embodiments, the predictive system 110 may be used to determine the lowest free energy structure of a given physical system.

In some embodiments, the generated energy data may also be used for improving sampling of possible conformers in a physical system 300. For example, the predictive system 110 may compute importance weights based on the first and second energy differences, determine confidence levels, and/or select conformers based on the first and second energy differences.

Experimental Results

Figure 8A:
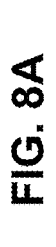
FIG. 8A shows the free energy surface comparison for the molecule alanine dipeptide.
Figure 8B:
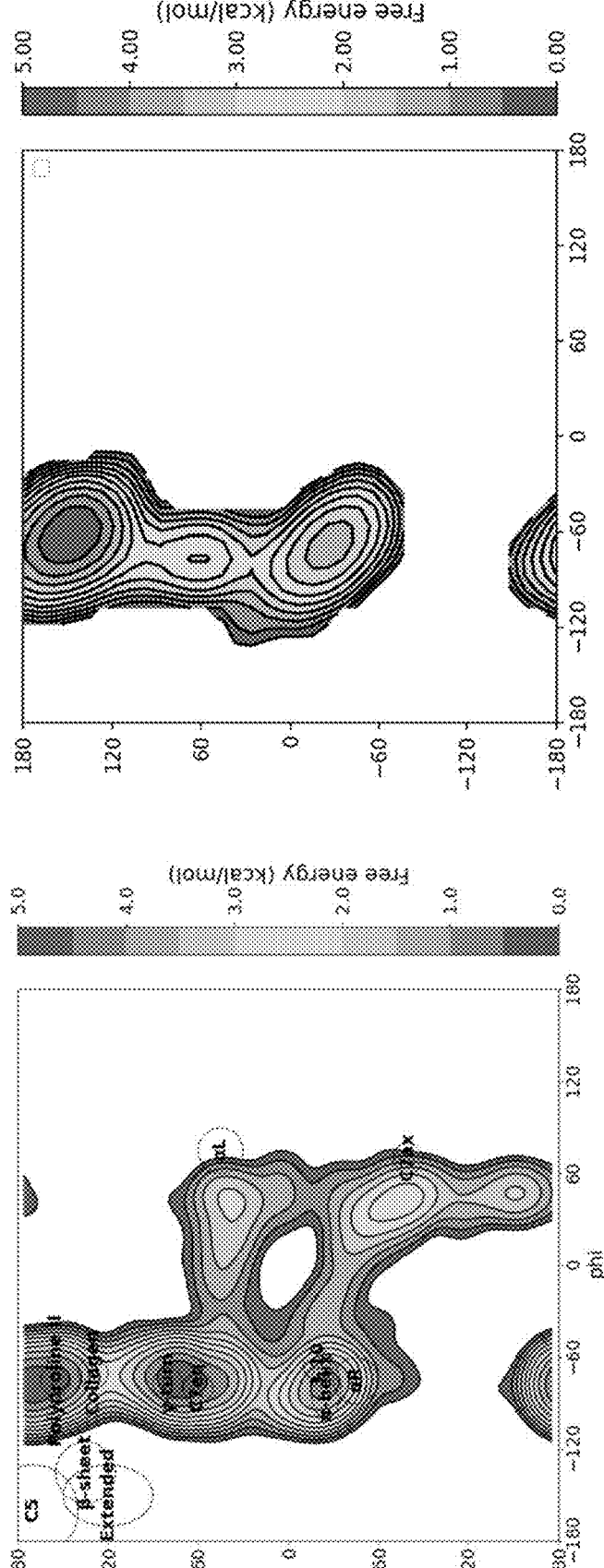
FIG. 8B shows the free energy surface comparison for the molecule proline dipeptide.
Figure 8C:
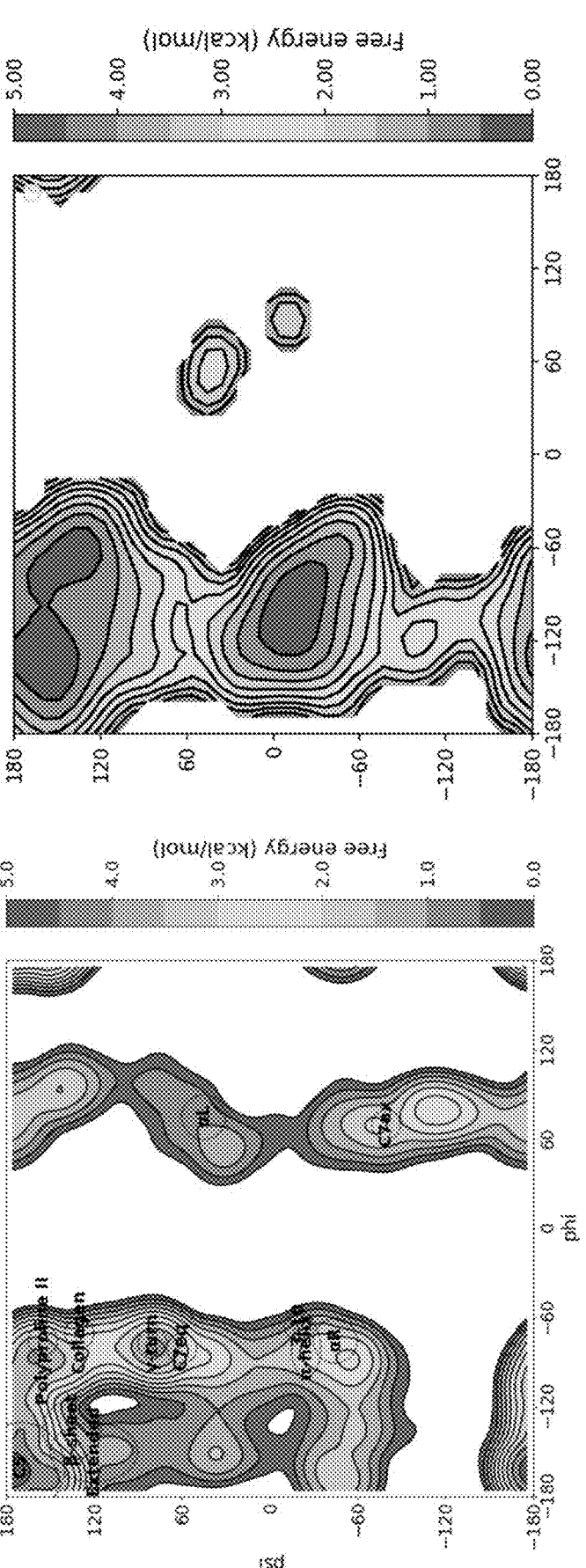
FIG. 8C shows the free energy surface comparison for the molecule threonine dipeptide.

FIG. 8A through 8C are plots that compare the simulated physical structures to ground truth data, in accordance with some embodiments. Each plot shows free energy levels in various angles and coordinates of a physical structure that is simulated by a machine-learned model and the ground truth data. The energy level at the angle phi and psi are mapped relative to each other. In each figure, the left plot shows the model-predicted output, and the right plot shows the experimentally observed relations between psi and phi. FIG. 8A shows the conformational distribution comparison for the molecule alanine dipeptide. FIG. 8B shows the conformational distribution comparison for the molecule proline dipeptide. FIG. 8C shows the conformational distribution comparison for the molecule threonine dipeptide.

Computing Machine Architecture

Figure 9:
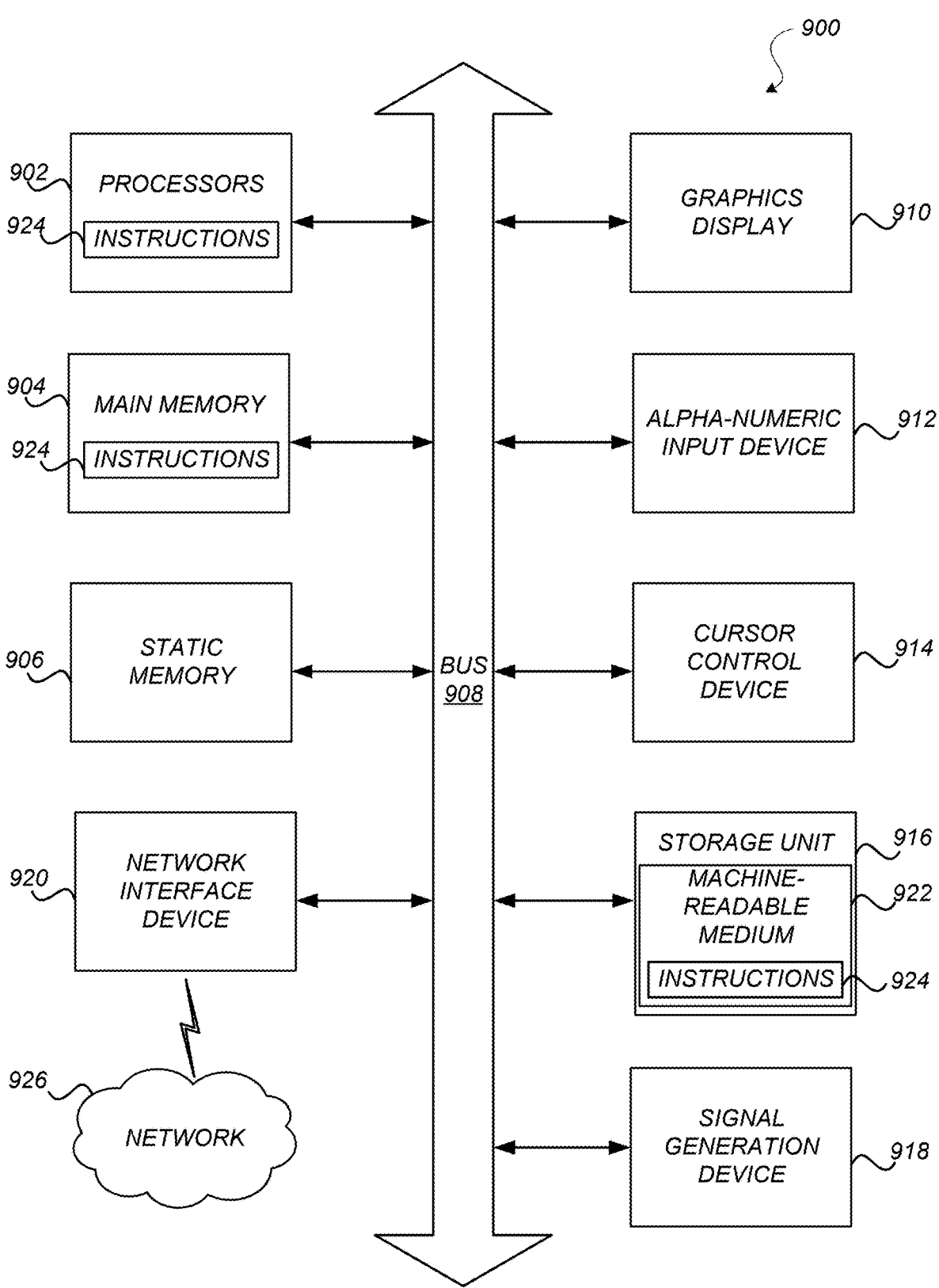
FIG. 9 is a block diagram illustrating components of an example computing machine, in accordance with some embodiments.

FIG. 9 is a block diagram illustrating components of an example computing machine that is capable of reading instructions from a computer-readable medium and executing them in a processor (or controller). A computer described herein may include a single computing machine shown in FIG. 9, a virtual machine, a distributed computing system that includes multiple nodes of computing machines shown in FIG. 9, or any other suitable arrangement of computing devices.

By way of example, FIG. 9 shows a diagrammatic representation of a computing machine in the example form of a computer system 900 within which instructions 924 (e.g., software, source code, program code, expanded code, object code, assembly code, or machine code), which may be stored in a computer-readable medium for causing the machine to perform any one or more of the processes discussed herein may be executed. In some embodiments, the computing machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The structure of a computing machine described in FIG. 9 may correspond to any software, hardware, or combined components shown in FIGS. 1 and 2. While FIG. 9 shows various hardware and software elements, each of the components described in FIGS. 1 and 2 may include additional or fewer elements.

By way of example, a computing machine may be a personal computer (PC), a tablet PC, a set-top box (STB), a personal digital assistant (PDA), a cellular telephone, a smartphone, a web appliance, a network router, an internet of things (IoT) device, a switch or bridge, or any machine capable of executing instructions 924 that specify actions to be taken by that machine. Further, while only a single machine is illustrated, the terms "machine" and "computer" may also be taken to include any collection of machines that individually or jointly execute instructions 924 to perform any one or more of the methodologies discussed herein.

The example computer system 900 includes one or more processors 902 such as a CPU (central processing unit), a GPU (graphics processing unit), a TPU (tensor processing unit), a DSP (digital signal processor), a system on a chip (SOC), a controller, a state equipment, an application-specific integrated circuit (ASIC), a field-programmable gate array (FPGA), or any combination of these. Parts of the computing system 900 may also include a memory 904 that stores computer code including instructions 924 that may cause the processors 902 to perform certain actions when the instructions are executed, directly or indirectly by the processors 902. Instructions can be any directions, commands, or orders that may be stored in different forms, such as equipment-readable instructions, programming instructions including source code, and other communication signals and orders. Instructions may be used in a general sense and are not limited to machine-readable codes. One or more steps in various processes described may be performed by passing through instructions to one or more multiply-accumulate (MAC) units of the processors.

One or more methods described herein improve the operation speed of the processor 902 and reduce the space required for the memory 904. For example, the database processing techniques described herein reduce the complexity of the computation of the processor 902 by applying one or more novel techniques that simplify the steps in training, reaching convergence, and generating results of the processors 902. The algorithms described herein also reduce the size of the models and datasets to reduce the storage space requirement for memory 904.

The performance of certain operations may be distributed among more than one processor, not only residing within a single machine, but deployed across a number of machines. In some example embodiments, the one or more processors or processor-implemented modules may be located in a single geographic location (e.g., within a home environment, an office environment, or a server farm). In other example embodiments, one or more processors or processor-implemented modules may be distributed across a number of geographic locations. Even though the specification or the claims may refer to some processes to be performed by a processor, this may be construed to include a joint operation of multiple distributed processors. In some embodiments, a computer-readable medium comprises one or more computer-readable media that, individually, together, or distributively, comprise instructions that, when executed by one or more processors, cause a processor (including in the situation of one or more processors) to perform, individually, together, or distributively, the steps of the instructions stored on the one or more computer-readable media. Similarly, a processor comprises one or more processors or processing units that, individually, together, or distributively, perform the steps of instructions stored on a computer-readable medium. In various embodiments, the discussion of one or more processors that carry out a process with multiple steps does not require any one of the processors to carry out all of the steps. For example, a processor A can carry out step A, a processor B can carry out step B using, for example, the result from the processor A, and a processor C can carry out step C, etc. The processors may work cooperatively in this type of situation such as in multiple processors of a system in a chip, in Cloud computing, or in distributed computing.

The computer system 900 may include a main memory 904, and a static memory 906, which are configured to communicate with each other via a bus 908. The computer system 900 may further include a graphics display unit 910 (e.g., a plasma display panel (PDP), a liquid crystal display (LCD), a projector, or a cathode ray tube (CRT)). The graphics display unit 910, controlled by the processor 902, displays a graphical user interface (GUI) to display one or more results and data generated by the processes described herein. The computer system 900 may also include an alphanumeric input device 912 (e.g., a keyboard), a cursor control device 914 (e.g., a mouse, a trackball, a joystick, a motion sensor, or other pointing instruments), a storage unit 916 (a hard drive, a solid-state drive, a hybrid drive, a memory disk, etc.), a signal generation device 918 (e.g., a speaker), and a network interface device 920, which also are configured to communicate via the bus 908.

The storage unit 916 includes a computer-readable medium 922 on which are stored instructions 924 embodying any one or more of the methodologies or functions described herein. The instructions 924 may also reside, completely or at least partially, within the main memory 904 or within the processor 902 (e.g., within a processor's cache memory) during execution thereof by the computer system 900, the main memory 904 and the processor 902 also constituting computer-readable media. The instructions 924 may be transmitted or received over a network 926 via the network interface device 920.

While computer-readable medium 922 is shown in an example embodiment to be a single medium, the term "computer-readable medium" should be taken to include a single medium or multiple media (e.g., a centralized or distributed database, or associated caches and servers) able to store instructions (e.g., instructions 924). The computer-readable medium may include any medium that is capable of storing instructions (e.g., instructions 924) for execution by the processors (e.g., processors 902) and that causes the processors to perform any one or more of the methodologies disclosed herein. The computer-readable medium may include, but not be limited to, data repositories in the form of solid-state memories, optical media, and magnetic media. The computer-readable medium does not include a transitory medium such as a propagating signal or a carrier wave.

EXAMPLE EMBODIMENTS

Embodiment 1. A method comprising: accessing, by a predictive system, a set of physical structures corresponding to one or more molecules, each physical structure representative of a conformer of the one or more molecules; encoding, by the predictive system, the accessed physical structures to produce a set of encoded physical structures by encoding, for each accessed physical structure, a position of each atom of the one or more molecules within the accessed physical structure; training, by the predictive system, a machine-learned model; and retraining, by the predictive system, the machine-learned model by iteratively: accessing a set of two or more candidate physical structures for the one or more molecules; determining using the machine-learned model a first energy difference among the set of candidate physical structures for the one or more molecules, the first energy difference corresponding to a ranking of the machine-learned model; obtaining a second energy difference between a set of physical structures corresponding to the set of candidate physical structures using an energy function; and retraining the machine-learned model using the set of candidate physical structures, the first energy difference, and the second energy difference.

Embodiment 2. The method of embodiment 1, wherein encoding an accessed physical structure comprises: converting one or more structural formulas of the one or more molecules into a sequence string representation of the one or more molecules; tokenizing the sequence string representation of the one or more molecules to produce a tokenized structural formula; tokenizing, for each atom in the one or more molecules, coordinates for the atom within the accessed physical structure to produce tokenized coordinates for the atom; and combining the tokenized structural formula and the tokenized coordinates for each atom to produce a tokenized physical structure corresponding to the accessed physical structure.

Embodiment 3. The method of embodiment 2, wherein tokenizing coordinates for the atom within the accessed physical structure comprises: pixelating a rendered sphere to produce a set of pixels each corresponding to a location on the surface of the rendered sphere; tokenizing, for a first atom in the one or more molecules, coordinates at a center of the sphere; and tokenizing, for each additional atom in the one or more molecules, coordinates corresponding to a pixel selected from the set of pixels based on a location of the additional atom relative to the center of the sphere.

Embodiment 4. The method of embodiment 3, wherein two or more additional atoms define a plane relative to the center of the sphere.

Embodiment 5. The method of embodiment 2, wherein tokenizing coordinates for the atom within the accessed physical structure comprises using a Cartesian coordinate system, an xyz coordinate system, an octree coordinate system, a polar coordinate system, a cylindrical coordinate system, or a barycentric coordinate system to generate the coordinates.

Embodiment 6. The method of embodiment 2, wherein the sequence string representation of the one or more molecules includes an ordered set of atoms, and wherein the coordinates for an atom comprise coordinates relative to a center of a coordinate sphere.

Embodiment 7. The method of embodiment 1, wherein the machine-learned model is iteratively retrained until one or more retraining criteria is satisfied.

Embodiment 8. The method of embodiment 7, wherein the retraining criteria is satisfied when an average difference between the first energy difference and the second energy difference for a threshold number of consecutive iterations is less than a threshold difference.

Embodiment 9. The method of embodiment 7, wherein the retraining criteria is satisfied when a distribution of candidate physical structures generated over a threshold number of consecutive iterations is within a threshold difference from a Boltzmann distribution.

Embodiment 10. The method of embodiment 7, wherein the retraining criteria is satisfied when performance measurement of a holdout set starts to decrease.

Embodiment 11. The method of embodiment 1, wherein retraining the machine-learned model comprises modifying weights of one or more layers of the machine-learned model to minimize a difference between the first energy difference and the second energy difference over subsequent iterations.

Embodiment 12. The method of embodiment 1, wherein retraining the machine-learned model comprises modifying weights of one or more layers of the machine-learned model by: generating a set of token sequences representing two or more physical structures; store activation outputs corresponding to the tokens in the token sequences; determining an aggregated energy state for each token sequence; and determining backpropagated gradients based on comparing the aggregated energy states for the token sequences.

Embodiment 13. The method of embodiment 1, wherein the first energy difference is determined based at least in part on a Boltzmann probability ratio between the set of candidate physical structures.

Embodiment 14. The method of embodiment 1, wherein the machine-learned model is configured to: determine, for a candidate physical structure, a force associated with each atom in the one or more molecules based on a relative energy associated with a plurality of neighboring positions for the atom.

Embodiment 15. The method of embodiment 14, wherein the machine-learned model is retrained based on a difference in forces associated with the candidate physical structures.

Embodiment 16. The method of embodiment 14, wherein the force associated with each atom in the model is based on a collective gradient of the relative energy associated with the plurality of neighboring positions for the atom, wherein the collective gradient is determined based on a vector to a neighboring position from which a finite difference gradient is calculated.

Embodiment 17. The method of embodiment 14, wherein a determined force associated with an atom in the one or more molecules is based on forces associated with one or more preceding atoms in the sequence string representation of the one or more molecules.

Embodiment 18. The method of embodiment 14, wherein the relative energies associated with each of the plurality of neighboring positions for the atom are determined using a softmax output of the machine-learned model.

Embodiment 19. The method of embodiment 14, wherein a determined force associated with an atom in the one or more molecules is based on, for each of the plurality of neighboring positions for the atom, the relative energy associated with the neighboring position and a distance between the atom and the neighboring position.

Embodiment 20. The method of embodiment 14, wherein a determined force generated by the machine-learned model associated with an atom in the one or more molecules is based additionally on reference forces applied from a solvent or solution on the atom in the one or more molecules.

Embodiment 21. The method of embodiment 14, wherein a determined force generated by the machine-learned model associated with an atom in the one or more molecules is based additionally on inherent forces in a physical system comprising the one or more molecules.

Embodiment 22. The method of embodiment 1, wherein an atom in an encoded physical structure is encoded with multiple tokens, each token representing decreasing significance of the atom's coordinates.

Embodiment 23. The method of embodiment 1, further comprising fine tuning, by the predictive system, the machine-learning model by using experimentally determined structure of the one or more molecules, optionally wherein the experimentally determined structure comprises a crystallographic structure of the one or more molecules.

Embodiment 24. The method of embodiment 23, further comprising obtaining the experimentally determined structure of the one or more molecules.

Embodiment 25. The method of embodiment 1, further comprising: after the machine-learned model is retrained, generating, by the predictive system, a target probability distribution of structures for a target molecule or a portion thereof.

Embodiment 26. The method of embodiment 25, further comprising: generating, by the predictive system, a probability distribution of structures for a molecule or a portion thereof.

Embodiment 27. The method of embodiment 26, further comprising: comparing the target probability distribution and the generated probability distribution to predict a binding affinity between the target molecule or a portion thereof and another molecule or a portion thereof.

Embodiment 28. The method of embodiment 27, further comprising: experimentally validating the binding affinity.

Embodiment 29. The method of embodiment 1, wherein obtaining the second energy difference comprises performing a quantum mechanical energy calculation.

Embodiment 30. The method of embodiment 1, wherein encoding an accessed physical structure comprises using a roto-translational transformation to encode spatial data of one or more atoms in the one or more molecules.

Embodiment 31. The method of embodiment 1, wherein the machine-learned model is a pretrained machine-learned language model and retraining the machine-learned model comprises fine tuning the machine-learned model using training samples of physical systems.

Embodiment 32. The method of embodiment 1, further comprising: computing importance weights based on the first and second energy differences, determining confidence levels, or selecting conformers based on the first and second energy differences.

Embodiment 33. The method of embodiment 1, wherein encoding the accessed physical structures comprises generating a series of tokens, and generating the series of tokens comprises: generating, for a first atom, a first set of tokens; and generating, for a second atom, a second set of tokens based on the first set of tokens.

Embodiment 34. The method of embodiment 1, wherein encoding the accessed physical structures comprises generating a series of tokens, and generating the series of tokens comprises: generating a first token for each atom in a set of atoms in the one or more molecule, wherein the first token of a particular atom represents most significant bits of coordinates of the particular atom; generating a second token for each atom in the molecule after the first tokens of the set of atoms are generated, wherein the second token of the particular atom represents less significant bits of the coordinates of the particular atom.

Embodiment 35. A method comprising: accessing, by a predictive system, a set of physical structures corresponding to one or more molecules, each physical structure representative of a conformer of the one or more molecules; encoding, by the predictive system, the accessed physical structures to produce a set of encoded physical structures by encoding, for each accessed physical structure, a position of each atom of the one or more molecules within the accessed physical structure; training, by the predictive system, a machine-learned language model; and retraining, by the predictive system, the machine-learned language model by iteratively: accessing a set of candidate physical structures for the one or more molecules using the machine-learned language model; determining a first energy difference between the set of candidate physical structures for the one or more molecules, the first energy difference corresponding to a ranking of the machine-learned language model; obtaining a second energy difference between a set of physical structures corresponding to the set of candidate physical structures using an energy function; and retraining the machine-learned language model using the set of candidate physical structures, the first energy difference, and the second energy difference.

Embodiment 36. A method comprising: accessing, by a predictive system, a set of physical structures corresponding to one or more molecules, each physical structure representative of a conformer of the one or more molecules; encoding, by the predictive system, the accessed physical structures to produce a set of encoded physical structures by encoding, for each accessed physical structure, a position of each atom of the one or more molecules within the accessed physical structure; training, by the predictive system, a transformer model; and retraining, by the predictive system, the transformer model by iteratively: accessing a set of candidate physical structures for the one or more molecules using the transformer model; determining a first energy difference between the set of candidate physical structures for the one or more molecules, the first energy difference corresponding to a ranking of the transformer model; obtaining a second energy difference between a set of physical structures corresponding to the set of candidate physical structures using an energy function; and retraining the transformer model using the set of candidate physical structures, the first energy difference, and the second energy difference.

Embodiment 37. A method comprising: accessing, by a predictive system, a set of physical structures corresponding to one or more molecules, each physical structure representative of a conformer of the one or more molecules; encoding, by the predictive system, the accessed physical structures to produce a set of encoded physical structures by encoding, for each accessed physical structure, a position of each atom of the one or more molecules within the accessed physical structure, wherein encoding the accessed physical structures comprises: converting one or more structural formulas of the one or more molecules into a sequence string representation of the one or more molecules, tokenizing the sequence string representation of the one or more molecules to produce a tokenized structural formula, tokenizing, for each atom in the one or more molecules, coordinates for the atom within the accessed physical structure to produce tokenized coordinates for the atom, and combining the tokenized structural formula and the tokenized coordinates for each atom to produce a tokenized physical structure corresponding to the accessed physical structure; and training, by the predictive system, a machine-learned model using the encoded physical structures.

Embodiment 38. A product for analysis of a structural feature of a target molecule, wherein the product is stored on a non-transitory computer readable medium and is generated by the method of any one of embodiments 1 and 35-37.

Embodiment 39. A method of analyzing a structure of a target molecule, comprising: obtaining a sequence string representation of the target molecule; tokenizing the sequence string representation of the target molecule to produce a tokenized structural formula; providing the tokenized structural formula to the product of embodiment 38; and obtaining a target probability distribution of structures of the target molecule from the product.

Embodiment 40. The method of embodiment 39, further comprising providing the target probability distribution of structures of the target molecule for identification or design of a second molecule binding to the target molecule.

Embodiment 41. The method of embodiment 39, further comprising identifying or designing a second molecule binding to the target molecule based on the target probability distribution.

Embodiment 42. The method of embodiment 40 or 41, wherein the designing the second molecule comprises generating a novel structure or modifying a known structure.

Embodiment 43. The method of any one of embodiments 40-42, further comprising experimentally or computationally determining binding between the target molecule and the second molecule.

Embodiment 44. The method of any one of embodiments 40-43, further comprising synthesizing the second molecule.

Embodiment 45. A ligand generated by the method of embodiment 44.

Embodiment 46. A method of predicting a binding affinity of a target molecule to a second molecule of embodiment 38, comprising: obtaining sequence string representations of the target molecule and the second molecule; tokenizing the sequence string representations to produce tokenized structural formulas of the target molecule and the second molecule; providing the tokenized structural formulas to the product of embodiment 38; and obtaining the binding affinity based on the target probability distributions of structures of the target molecule and the second molecule from the product.

Embodiment 47. The method of embodiment 46, further comprising providing the binding affinity for use in experimental or computational validation of the binding affinity of the target molecule to the second molecule.

Embodiment 48. The method of embodiment 46, further comprising experimentally or computationally validating the binding affinity of the target molecule to the second molecule.

Embodiment 49. The method of embodiment 46, further comprising providing the binding affinity for use in modifying the second molecule based on the obtained binding affinity.

Embodiment 50. The method of embodiment 46, further comprising modifying the second molecule based on the obtained binding affinity.

Embodiment 51. A method comprising: accessing, by a predictive system, a set of physical structures corresponding to one or more molecules, each physical structure representative of a conformer of the one or more molecules; encoding, by the predictive system, the accessed physical structures to produce a set of encoded physical structures by encoding, for each accessed physical structure, a position of each atom of the one or more molecules within the accessed physical structure, wherein encoding the accessed physical structures comprises: pixelating a rendered sphere to produce a set of pixels each corresponding to a location on the surface of the rendered sphere; tokenizing, for a first atom in the one or more molecules, coordinates at a center of the sphere; and tokenizing, for each additional atom in the one or more molecules, coordinates corresponding to a pixel selected from the set of pixels based on a location of the additional atom relative to the center of the sphere; and training, by the predictive system, a machine-learned model using the encoded physical structures.

Embodiment 52. A method comprising: accessing, by a predictive system, a set of physical structures corresponding to one or more molecules, each physical structure representative of a conformer of the one or more molecules; encoding, by the predictive system, the accessed physical structures to produce a set of encoded physical structures by encoding, for each accessed physical structure, a position of each atom of the one or more molecules within the accessed physical structure; and training, by the predictive system, a machine-learned model by iteratively: accessing a set of two or more candidate physical structures for the one or more molecules; determining, by the machine-learned model, a force associated with an atom in the one or more molecules based on a relative energy associated with a plurality of neighboring positions for the atom; comparing the force associated with the atom determined by the machine-learned model to ground truth force data to generate a difference between the force determined by the machine-learned model to the ground truth force data; and backpropagating the difference to the machine-learned model to adjust one or more parameters of the machine-learned model.

Additional Considerations

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

Any feature mentioned in one claim category, e.g. method, can be claimed in another claim category, e.g. computer program product, system, or storage medium, as well. The dependencies or references in the attached claims are chosen for formal reasons only. However, any subject matter resulting from a deliberate reference back to any previous claims (in particular multiple dependencies) can be claimed as well, so that any combination of claims and the features thereof is disclosed and can be claimed regardless of the dependencies chosen in the attached claims. The subject matter may include not only the combinations of features as set out in the disclosed embodiments but also any other combination of features from different embodiments. Various features mentioned in the different embodiments can be combined with explicit mentioning of such combination or arrangement in an example embodiment or without any explicit mentioning. Furthermore, any of the embodiments and features described or depicted herein may be claimed in a separate claim and/or in any combination with any embodiment or feature described or depicted herein or with any of the features.

Some portions of this description describe the embodiments in terms of algorithms and symbolic representations of operations on information. These operations and algorithmic descriptions, while described functionally, computationally, or logically, are understood to be implemented by computer programs or equivalent electrical circuits, microcodes, or the like. Furthermore, it has also proven convenient at times, to refer to these arrangements of operations as engines, without loss of generality. The described operations and their associated engines may be embodied in software, firmware, hardware, or any combinations thereof.

Any of the steps, operations, or processes described herein may be performed or implemented with one or more hardware or software engines, alone or in combination with other devices. In some embodiments, a software engine is implemented with a computer program product comprising a computer-readable medium containing computer program code, which can be executed by a computer processor for performing any or all of the steps, operations, or processes described. The term "steps" does not mandate or imply a particular order. For example, while this disclosure may describe a process that includes multiple steps sequentially with arrows present in a flowchart, the steps in the process do not need to be performed in the specific order claimed or described in the disclosure. Some steps may be performed before others even though the other steps are claimed or described first in this disclosure. Likewise, any use of (i), (ii), (iii), etc., or (a), (b), (c), etc. in the specification or in the claims, unless specified, is used to better enumerate items or steps and also does not mandate a particular order.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein. In addition, the term "each" used in the specification and claims does not imply that every or all elements in a group need to fit the description associated with the term "each." For example, "each member is associated with element A" does not imply that all members are associated with an element A. Instead, the term "each" only implies that a member (of some of the members), in a singular form, is associated with an element A. In claims, the use of a singular form of a noun may imply at least one element even though a plural form is not used.

Finally, the language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights.

What is claimed is:

1. A method comprising:

accessing, by a predictive system, a set of physical structures corresponding to a physical system, each physical structure representative of a configuration of the physical system;

encoding, by the predictive system, the accessed physical structures to produce a set of encoded physical structures by encoding, for each accessed physical structure, a position of each constituent unit of the physical system within the accessed physical structure;

training, by the predictive system, a machine-learned transformer model, the machine-learned transformer model comprising one or more attention blocks configured to model interactions of constituent units by generating activation outputs as relative energy values that correspond to a physical structure distribution; and retraining, by the predictive system, the machine-learned transformer model by iteratively:

accessing a set of candidate physical structures for the physical system in a training sample;

converting, through forward propagation of the machine-learned transformer model, the candidate physical structures into a plurality of token sequences and corresponding activation outputs, wherein each token sequence represents a candidate physical structure of the physical system, determining a first energy difference between two candidate physical structures, the first energy difference being an aggregation of the corresponding activation outputs from the attention blocks;

comparing the first energy difference to a second energy difference between a set of physical structures corresponding to the set of candidate physical structures, wherein the second energy difference is derived from a ground truth distribution in the training sample using an energy function;

backpropagating the second energy difference to the transformer model to adjust one or more parameters in the attention blocks of the machine-learned transformer model; and retraining the machine-learned transformer model using the set of candidate physical structures, the first energy difference, and the second energy difference; and receiving a sequence of a target molecule; and using the one or more attention blocks in the trained machine-learned transformer model to determine energy values over a set of physical structures of the target molecule.

2. The method of claim 1, wherein encoding a particular accessed physical structure of the accessed physical structures comprises:

converting one or more structural expressions of the physical system into a sequence string representation of the physical system;

tokenizing the sequence string representation of the physical system to produce a tokenized structural expression;

tokenizing, for each constituent unit in the physical system, coordinates for the constituent unit within the particular accessed physical structure to produce tokenized coordinates for the constituent unit; and combining the tokenized structural expression and the tokenized coordinates for each constituent unit to produce a tokenized physical structure corresponding to the particular accessed physical structure.

3. The method of claim 2, wherein tokenizing coordinates for the constituent unit within the particular accessed physical structure comprises:

pixelating a rendered sphere to produce a set of pixels each corresponding to a location on the surface of the rendered sphere;

tokenizing, for a first constituent unit in the physical system, coordinates at a center of the sphere; and tokenizing, for each additional constituent unit in the physical system, coordinates corresponding to a pixel selected from the set of pixels based on a location of the additional constituent unit relative to the center of the sphere.

4. The method of claim 2, wherein tokenizing coordinates for the constituent unit within the particular accessed physical structure comprises using a Cartesian coordinate system, an xyz coordinate system, an octree coordinate system, a polar coordinate system, a cylindrical coordinate system, or a barycentric coordinate system to generate the coordinates.

5. The method of claim 2, wherein the sequence string representation of the physical system includes an ordered set of constituent units, and wherein the coordinates for a constituent unit comprise coordinates relative to a center of a coordinate sphere.

6. The method of claim 1, wherein the machine-learned transformer model is iteratively retrained until one or more retraining criteria is satisfied.

7. The method of claim 6, wherein the retraining criteria is satisfied when performance measurement of a holdout set starts to decrease.

8. The method of claim 1, wherein retraining the machine-learned transformer model comprises modifying weights of one or more layers of the machine-learned transformer model to minimize a difference between the first energy difference and the second energy difference over subsequent iterations.

9. The method of claim 1, wherein retraining the machine-learned transformer model comprises modifying weights of one or more layers of the machine-learned transformer model by:

generating a set of token sequences representing two or more physical structures;

store activation outputs corresponding to the tokens in the token sequences;

determining an aggregated energy state for each token sequence; and determining backpropagated gradients based on comparing the aggregated energy states for the token sequences.

10. The method of claim 1, wherein the first energy difference is determined based at least in part on a Boltzmann probability ratio between the set of candidate physical structures.

11. The method of claim 1, wherein the machine-learned transformer model is configured to:

determine, for a candidate physical structure, a force associated with each constituent unit in the physical system based on a relative energy associated with a plurality of neighboring positions for the constituent unit.

12. The method of claim 11, wherein the machine-learned transformer model is retrained further based on a difference in forces associated with the candidate physical structures.

13. The method of claim 11, wherein the force associated with each constituent unit in the machine-learned transformer model is based on a collective gradient of the relative energy associated with the plurality of neighboring positions for the constituent unit, wherein the collective gradient is determined based on a vector to a neighboring position from which a finite difference gradient is calculated.

14. The method of claim 11, wherein a determined force associated with a constituent unit in the physical system is based on forces associated with one or more preceding constituent units in a sequence string representation of the physical system.

15. The method of claim 11, wherein the relative energies associated with each of the plurality of neighboring positions for the constituent unit are determined using a softmax output of the machine-learned transformer model.

16. The method of claim 11, wherein a determined force associated with a constituent unit in the physical system is based on, for each of the plurality of neighboring positions for the constituent unit, the relative energy associated with the neighboring position and a distance between the constituent unit and the neighboring position.

17. The method of claim 11, wherein a determined force generated by the machine-learned transformer model associated with a constituent unit in the physical system is based additionally on reference forces applied from a solvent or solution on the constituent unit in the physical system.

18. The method of claim 11, wherein a determined force generated by the machine-learned transformer model associated with a constituent unit in the physical system is based additionally on inherent forces in a physical system comprising the physical system.

19. The method of claim 1, wherein a constituent unit in an encoded physical structure is encoded with multiple tokens, each token representing decreasing significance of the constituent unit's coordinates.

20. The method of claim 1, further comprising fine tuning, by the predictive system, the machine-learned transformer model by using experimentally determined structures of the physical system, optionally wherein the experimentally determined structures comprises a crystallographic structure of the physical system.

21. The method of claim 1, further comprising:
generating, by the predictive system, a probability distribution of structures for a physical system or a portion thereof.

22. The method of claim 21, further comprising:
comparing a target probability distribution and the generated probability distribution to predict a binding affinity between a first physical system or a portion thereof and a second physical system or a portion thereof.

23. The method of claim 1, wherein obtaining the second energy difference comprises performing a quantum mechanical energy calculation.

24. The method of claim 1, wherein encoding an accessed physical structure comprises using a roto-translational transformation to encode spatial data of one or more constituent units in the physical system.

25. The method of claim 1, wherein the machine-learned transformer model is a pretrained machine-learned language model and retraining the machine-learned transformer model comprises fine tuning the machine-learned transformer model using training samples of physical systems.

26. The method of claim 1, further comprising:
computing importance weights based on the first and second energy differences, determining confidence levels, or selecting configurations based on the first and second energy differences.

27. The method of claim 1, wherein encoding the accessed physical structures comprises generating a series of tokens, and generating the series of tokens comprises:
generating, for a first constituent unit, a first set of tokens; and
generating, for a second constituent unit, a second set of tokens based on the first set of tokens.

28. The method of claim 1, further comprising:
generating, using the machine-learned transformer model, a molecular sequence that is predicted to be binding to the target molecule.

* * * * *